(12) United States Patent
Aldrich et al.

(10) Patent No.: US 8,903,688 B1
(45) Date of Patent: Dec. 2, 2014

(54) TEST ENTITIES FOR EVALUATION AND VALIDATION OF A MODEL

(75) Inventors: William J. Aldrich, Natick, MA (US); Grégoire Hamon, Boston, MA (US); Anjali Dattatray Joshi, Auburndale, MA (US)

(73) Assignee: The MathWorks, Inc., Natick, MA (US)

( * ) Notice: Subject to any disclaimer, the term of this patent is extended or adjusted under 35 U.S.C. 154(b) by 846 days.

(21) Appl. No.: 13/078,353

(22) Filed: Apr. 1, 2011

Related U.S. Application Data

(63) Continuation-in-part of application No. 12/684,500, filed on Jan. 8, 2010, now abandoned, which is a continuation of application No. 11/096,528, filed on Mar. 31, 2005, now Pat. No. 7,680,632.

(51) Int. Cl.
*G06F 17/50* (2006.01)
*G06G 7/48* (2006.01)

(52) U.S. Cl.
USPC .............................................. 703/6; 716/136

(58) Field of Classification Search
CPC ..... G06F 8/34; G06F 17/504; G06F 17/5036; G06F 17/5068; G06F 17/5081; G06F 17/5022
USPC ....................... 703/1, 2, 6; 716/106, 111, 136
See application file for complete search history.

(56) References Cited

U.S. PATENT DOCUMENTS 7,774,172 B1 * 8/2010 Yunt et al. .......................... 703/2
2004/0158804 A1 * 8/2004 Hayles .............................. 716/6

OTHER PUBLICATIONS

Silva, B. Izaias et al., "Modeling and Verifying Hybrid Dynamic Systems Using CheckMate," retrieved online from http://www.ece.cmu.edu/~webk/checkmate/download/papers/ADPM$_{13}$ checkmate.pdf, pp. 1-7 (2001).

* cited by examiner

*Primary Examiner* — Kamini S Shah
*Assistant Examiner* — Andre Pierre Louis
(74) *Attorney, Agent, or Firm* — Nelson Mullins Riley & Scarborough LLP

(57) ABSTRACT

Methods, mediums, and systems are presented herein for evaluating points of observation in a model by validating conditions in the model. A condition is a location in a model which may be either satisfied or unsatisfied by underlying data associated with the condition. Conditions may be placed in an enforced satisfied status or enforced unsatisfied status in order to instruct a verification tool to assume that the condition is satisfied regardless of whether the condition would actually be satisfied by underlying data. A first condition in an enforced satisfied status or an enforced unsatisfied status may be used to determine whether a second condition is satisfied, or whether a second condition satisfiable.

20 Claims, 15 Drawing Sheets

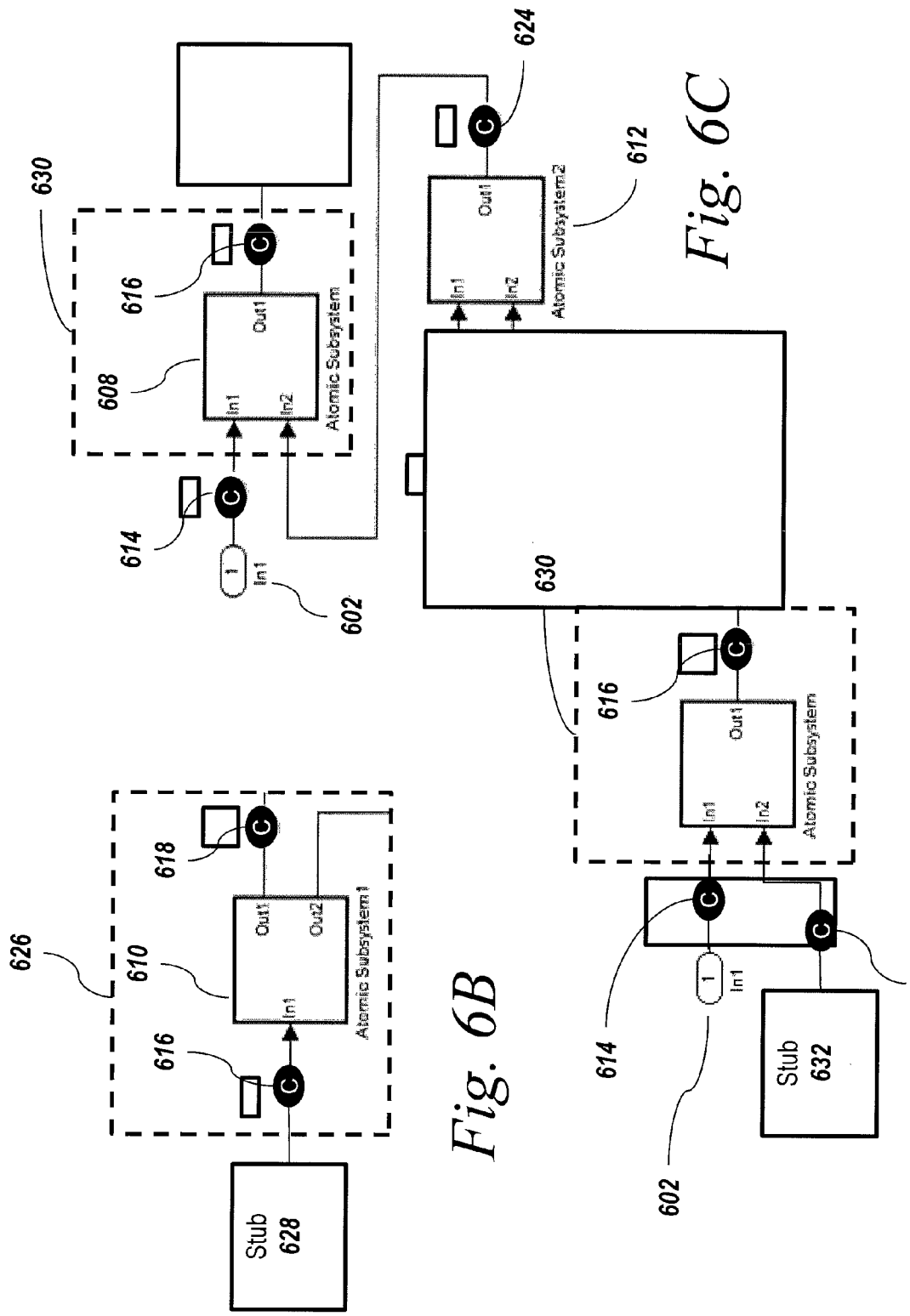

TEST ENTITIES FOR EVALUATION AND VALIDATION OF A MODEL

RELATED APPLICATIONS

This application is a continuation-in-part of U.S. patent application Ser. No. 12/684,500, entitled "TEST PRECONDITION ITEMS FOR AUTOMATED ANALYSIS AND TEST GENERATION," filed on Jan. 8, 2010, which is a continuation of co-pending U.S. patent application Ser. No. 11/096,528, filed Mar. 31, 2005. The disclosure of said applications are hereby incorporated by reference herein in their entirety.

BACKGROUND INFORMATION

Graphical modeling environments, such as the technical computing and block diagram modeling environment of MATLAB® and Simulink® from the MathWorks, Inc. of Natick, Mass., can provide a "model-based design" approach to designing an implementation, such as for embedded computational hardware. The term "model-based design" is used to refer to a graphical model acting as a design or a specification for implementation. A model-based design may be used as a design specification for an implementation, such as an implementation of an algorithm in hardware circuitry, the implementation of code to run on a microprocessor, or software to run in a network environment.

A graphical modeling environment can produce model-based designs in graphical form, such as a block diagram model, to specify computations, operations, or functionality that can be performed on computational hardware such as a general purpose processor, microcontroller, DSP, FPGA, PLD, or an ASIC. As a design specification, a model-based design can drive the building process of an implementation of the design. For instance, the model-based design can act as a specification from which to automatically generate code from a block diagram model to provide an executable for testing and verification on a target system.

Model-based designs represented by graphical models can be tested using simulation. The simulation may be provided by the modeling environment. For example, Simulink® from The MathWorks, Inc. of Natick, Mass., provides an environment for simulating graphical models to test the model-based design. Simulation may be used by a model designer to identify design issues during the design stage at the system level. Although simulation may be used to functionally verify some behavior of the design, simulation may not be exhaustive or deterministic such that it covers all desired or unwanted circumstances and occurrences of design behavior.

Verification tools can be used to provide a more formal and comprehensive approach to testing and verifying a model-based design. Verification tools are available that apply various formal methods and techniques for providing comprehensive coverage and verifying the behavior of a model-based design under test. The verification tool may run a multitude of combinations of scenarios with a significant portion or all of the possible input values. Running comprehensive or multiple verification scenarios in a verification tool may be time consuming and resource intensive. The techniques and methods used by the verification tool may exercise behavior or functionality that is not of concern to the model-based designer or that is not practical or realistic in the intended application of the implementation of the model-based design. Therefore, it may be time consuming, resource intensive or inconvenient to obtain or review the results of the portion of the verification that is of interest to the designer or realistic for the design.

Typically, the configuration of the verification may be performed in the verification tool to run certain tests or verification scenarios desired for the design. The verification tool may be configured to limit the verification scenarios or to cover only a certain combination of occurrences. Setting up and generating verification scenarios in a verification tool may consume significant time and resources. The verification tool may have its own configuration environment and language different than the graphical modeling environment. As such, any verification scenario configuration and verification results may be described in terms of the form, language, and context of the verification tool. Thus, it may be challenging to relate the verification scenario configuration and verification results to the model-based design represented by the graphical model.

SUMMARY OF THE INVENTION

Methods, mediums, and systems are described herein for using a design element in a graphical model to represent and identify a condition for use by a verification tool in verifying an executable form of the design represented by the graphical model. A condition is a location in a model which may be either satisfied or unsatisfied by underlying data associated with the condition. Conditions may be placed in an enforced satisfied status or enforced unsatisfied status in order to instruct a verification tool to assume that the condition is satisfied regardless of whether the condition would actually be satisfied by underlying data. A first condition in an enforced satisfied status or an enforced unsatisfied status may be used to determine whether a second condition is satisfied, or whether a second condition satisfiable.

According to one exemplary embodiment, a model is provided in a graphical modeling environment. The model may include a plurality of points of observation related to data in a dynamic model. For example, if the model is a block diagram model of a system, the points of observation may be blocks, subsystems including blocks, or a mixture of blocks and subsystems. At least a first point of observation may be provided.

A plurality of conditions may be identified in the model. The conditions may include at least a first condition and a second condition. The first condition may be located in the graphical model, and the second condition may be associated with an output of the first point of observation. The first condition and second condition may be associated with at least one of a value or a range of values for one or more of the following: an output, a signal, an attribute of a signal, a state, a data element, a parameter, and a property of an object. The first and second points of observation may be graphically or textually indicated on the model.

A second point of observation may also be provided, the second point of observation being associated with output information that is used as input information into the first point of observation.

At least a portion of the model may be validated. Validating the portion may involve placing the first condition in an enforced satisfied status, verifying that the second condition is in a satisfied status based at least in part on the enforced satisfied status of the first condition, and, after verifying that the second condition is in a satisfied status, verifying that the first condition is in an unenforced satisfied status. The second condition may be used as a precondition to validate another portion of the model including a third condition.

Placing the first condition in an enforced satisfied status may include causing the second point of observation to output a value satisfying the first condition. Alternatively, placing the first condition in an enforced satisfied status may involve instructing the modeling environment that the input information to the first point of observation satisfies the first condition.

Validating the model may be done in response to an instruction, such as a user instruction. The instruction may identify one or more conditions which are indicated to be in an enforced satisfied status, and one or more conditions to be evaluated based at least in part on the one or more conditions indicated to be in an enforced satisfied status.

The validating may be performed during a simulation of the model, or during a design of the model. The first condition and second condition may be identified during a design of the model, for example using a verification tool displayed in a graphical user interface on a display device. The first condition and/or second condition may be associated with an element external to the model, such as an input source or output source. The first condition and/or the second condition may be activated or deactivated based on a state of the model during an execution of the model.

In another embodiment, validating the portion may involve placing the first condition in an enforced unsatisfied status, and determining whether it is possible to satisfy the second condition while the first condition is unsatisfied.

BRIEF DESCRIPTION OF THE DRAWINGS

FIG. 6B is an example of a portion 626 of the model 600 of FIG. 6A and a stub 628 for use in evaluating the portion 626.

FIG. 6C is an example of a portion 630 of the model 600 of FIG. 6A.

FIG. 6D is an example of a stub 632 for use in evaluating the portion 630 of FIG. 6C.

DETAILED DESCRIPTION

Methods, mediums, and systems are presented herein for evaluating points of observation in a model by validating conditions in the model. A condition is a location in a model which may be either satisfied or unsatisfied by underlying data associated with the condition. Conditions may be placed in an enforced satisfied status or enforced unsatisfied status in order to instruct a verification tool to assume that the condition is satisfied regardless of whether the condition would actually be satisfied by underlying data. A first condition in an enforced satisfied status or an enforced unsatisfied status may be used to determine whether a second condition is satisfied, or whether a second condition satisfiable. The second condition may be used to verify a third condition in the same or another portion of the model.

The embodiments described herein will be described solely for illustrative purposes relative to a graphical modeling and verification environment provided by the software products from The MathWorks, Inc. of Natick, Mass. Although the illustrative embodiments will be described relative to a MATLAB® and/or Simulink®-based application, including the use of Stateflow®, one of ordinary skill in the art will appreciate that the present invention may be applied to other graphical modeling and/or verification environments, such as (but not limited to) any environments using software products of SimMechanics, SimPowerSystems or SimDriveLine from The MathWorks, Inc. of Natick, Mass., LabVIEW® or MATRIXx from National Instruments, Inc., MSC.Adams® from MSC.Software Corporation of Santa Ana, Calif., Virtuoso from Cadence of San Jose, Calif., Dymola from Dynasim AB of Lund, Sweden, or Rational Rose from IBM of White Plains, N.Y.

Exemplary Environments

Figure 1:
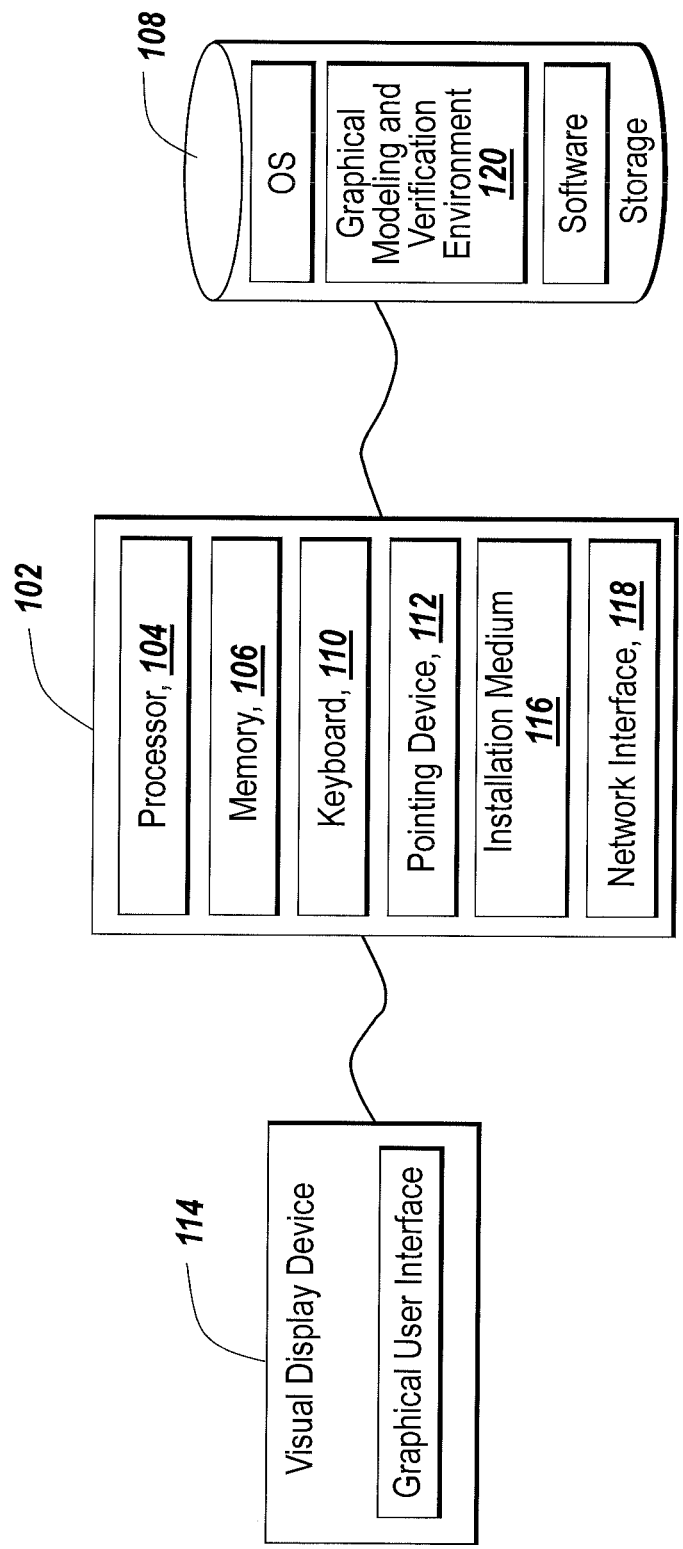
FIG. 1 is a block diagram of an illustrative computing device suitable for use in exemplary embodiments.

FIG. 1 depicts an environment that includes a computing device 102 having memory 106, on which software according to one embodiment of the present invention may be stored, a processor (CPU) 104 for executing software stored in the memory 106, and other programs for controlling system hardware. The memory 106 may be a non-transitory electronic-device-readable storage medium, such as a computer system memory or random access memory such as DRAM, SRAM, EDO RAM, etc. The memory 106 may comprise other types of memory as well, or combinations thereof. A human user may interact with the computing device 102 through a visual display device 114 such as a computer monitor, which may be used to display a graphical user interface (GUI).

The computing device 102 may include other I/O devices such a keyboard 110 and a pointing device 112, for example a mouse, for receiving input from a user. Optionally, the keyboard 110 and the pointing device 112 may be connected to the visual display device 114. Additionally, the computing device 102 may include any type of input device for receiving user input, such as a joystick. In other embodiments, the computing device 102 may include any type of haptic or tactile feedback device, such as a vibration generating mouse, or a force feedback device such as a force feedback joystick. Also, the computing device 102 may include any type of sound producing I/O device such as any suitable sound card. The computing device 102 may include other suitable conventional I/O peripherals.

For installing software programs, the computing device 102 may support any suitable device readable medium 116, such as a CD-ROM, DVD-ROM floppy disks, tape device, USB device, hard-drive, or any other suitable device. The computing device 102 may further comprise a storage device 108, such as a hard-drive or CD-ROM, for storing an operating system and other related software. A graphical modeling and verification environment 120 may comprise software that is installed via a device readable medium 116 and stored in the storage device 108. Additionally, the operating system and graphical modeling and verification environment 120 may be run from a bootable CD, such as, for example, KNOPPIX®, a bootable CD for GNU/Linux.

Additionally, the computing device 102 may include a network interface 118 to interface to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM), cluster interconnection (Myrinet), peripheral component interconnections (PCI, PCI-X), wireless connections, or some combination of any or all of the above. The network interface 118 may comprise a built-in network adapter, network interface card, PCMCIA network card, card bus network adapter, wireless network adapter, USB network adapter, modem or any other device suitable for interfacing the computing device 118 to any type of network capable of communication and performing the operations described herein. Moreover, the computing device 102 may be any computer system such as a workstation, desktop computer, server, laptop, handheld computer or other form of computing or telecommunications device that is capable of communication and that has sufficient processor power and memory capacity to perform the operations described herein.

Figure 2A:
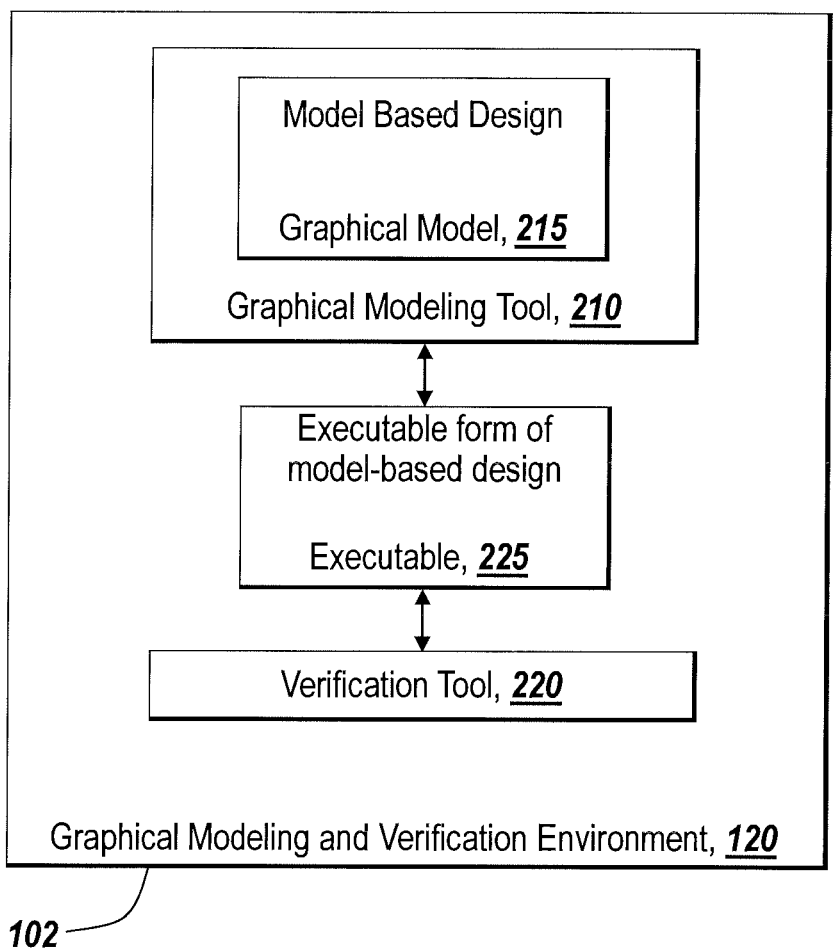
FIG. 2A is a block diagram of an illustrative graphical modeling and verification environment.

Exemplary embodiments may provide a graphical modeling and verification environment 120 as illustrated in FIG. 2A. In brief overview, the illustrative graphical modeling and verification environment 120 includes a graphical modeling tool 210 and a verification tool 220. The graphical modeling tool 210 provides an environment for the design and development of a model-based design represented by a graphical model 215. The verification tool 220 provides an environment for the test, analysis, and verification of an executable form 225 of the model-based design represented by the graphical model 215. The verification tool 220 may be in communication with or have any suitable type and/or form of interface to the graphical modeling tool 210.

The graphical modeling tool 210 comprises an environment for creating, editing, designing, simulating, testing, or otherwise providing any type and/or form of graphical model 215, such as block diagram model. In an exemplary embodiment and by way of example, the graphical modeling tool 210 may comprise Simulink®, Stateflow®, and/or SimMechanics manufactured by The MathWorks, Inc. of Natick, Mass. In the graphical modeling tool 210, configurable and customizable functional blocks are used to create block diagram models that may represent a design, or algorithm, for a control system, a signal processing system, a communication system, any other time-varying or dynamic system, any computational hardware device, or any software implementation. The graphical modeling tool 210 can be used to provide a model-based design approach to implementation of an item or system under design. A model-based design may be used as a design specification for an implementation, such as an implementation of an algorithm in hardware circuitry or the implementation of code or software to run on a processor.

Additionally, the graphical modeling tool 210 may comprise an automatic code generation application, such as the automatic code generator of Real-Time Workshop® from The MathWorks, Inc. of Natick, Mass., to generate source code from a graphical model 215 to translate the functionality of the graphical model 215 into an executable form, such as a program, that may be designed to run on any microprocessor, real-time operating system, or otherwise customized to run on a specific target hardware platform or for use by a verification tool 220.

The graphical model 215 can comprise any type and/or form of graphical model 215. The graphical modeling tool 215 may provide any type of tools, libraries, and/or configuration mechanisms to graphically create and/or edit a graphical model 215. The graphical model 215 may comprise a block diagram model provided by the Simulink® environment of The MathWorks, Inc. For example, the block diagram model 215 may comprise a series of different type of blocks arranged in a desired manner and connected via connection lines to represent signal values traversing the blocks. The graphical model 215 may comprise any type of element or construct to form a graphical model, such as connectors, blocks, or any other graphical form and representation of functionality supported by the graphical modeling tool 210. One ordinarily skilled in the art will recognize and appreciate the various forms of graphical models, and the elements and content thereof.

Additionally, the graphical modeling tool 210 may comprise a design and development environment for creating a state machine diagram representation in the graphical model 215. By way of example, the graphical modeling tool 210 may comprise Stateflow®, an interactive design and simulation tool for event-driven systems manufactured by The MathWorks, Inc. of Natick, Mass. The graphical modeling tool 210, such as Stateflow®, provides elements to describe a language, logic, and systems in a visual form, such as a form that is readable, and understandable by a human user, such as a designer. The graphical modeling tool 210 may provide a visual formalism of the item under design as represented by the graphical model 215.

The graphical modeling tool 210 may be able to execute the graphical model 215. For example, in the exemplary case using Simulink®, the graphical modeling tool 210 has an environment that provides for the simulation and debugging of the graphical model 215. Additionally, in other embodiments, the graphical modeling tool 210 may generate code of executable instructions representing the graphical model 215 to compile and build for executing on a target hardware platform and/or operating system. The graphical modeling tool 230 may comprise an automatic code generation application, such as the automatic code generator of Real-Time Workshop® from The MathWorks, Inc. of Natick, Mass., to generate source code from a graphical model 215 to translate the functionality of the graphical model 215 into an executable form, such as a program, that may be designed to run on any microprocessor, real-time operating system, or otherwise customized to run on a specific target hardware platform or for use by a verification tool 220.

Furthermore, the graphical modeling tool 210 may provide for implementation of any portion or any functionality of the graphical model 215 via instructions in any type of programming language, text-based, high-level, interpretative, or otherwise. With a MATLAB® and Simulink® based environment 120, the graphical modeling tool 210 may provide for or use executable instructions in the form of the textual programming language of MATLAB®. Any type and/or form of executable instructions, including interpretive programming languages, markup languages such as the HyperText Markup Language, scripting languages, and any code, such as libraries, executables, or scripts, may be used in providing the graphical model 215.

The verification tool 220 comprises a testing and verification environment for testing and verifying an executable form 225 of a design, such as a model-based-design represented by a graphical model 215 provided by the graphical modeling tool 210. The executable form 225 of the design under test may be provided by the automated code generator of the graphical modeling tool 210 as will be described in further detail later. The verification tool 220 may provide for the testing and verification of an executable 225 by any technique known to those ordinarily skilled in the art, such as, but not limited to, bounded model techniques, symbolic model techniques, test generation techniques, solving techniques, theorem proving techniques, temporal logic, exhaustive or deterministic techniques, or other mathematical or algorithm based techniques. In one aspect, the verification tool 220 may be described or referred to as using formal methods to perform formal verification of the executable 225 in comparison to simulating the graphical model 215 or corresponding executable form 225.

The verification tool 220 may be any type and/or form of verification tool 220. In some embodiments, the verification tool 220 may comprise any of the model-based test and verification related software products manufactured by Prover Technology AB of Stockholm, Sweden, Prover Technology, Inc. of San Mateo, Calif., Reactive Systems, Inc. of Falls Church, Va., or TNI-Software, part of the Valiosys Group with offices in Paris, France. In other embodiments, the verification tool 220 may comprise any custom verification tool 220 software or any portions of software that may be available to perform testing and verification. One ordinarily skilled in the art will recognize that the verification tool 220 may be any type and/or form of verification tool 220 and may use any type and/or form of testing or verification techniques, formal or otherwise.

The graphical modeling tool 210 and verification tool 220, and any portion thereof, can comprise an application, module, service, computer program, software component, web service, web component, library, or any other type and/or form of executable instruction which is designed to and capable of executing the functionality as described herein. Additionally, the graphical modeling tool 210 and verification tool 220 may be configured to and capable of running any of the modules, libraries or software components of the MATLAB® and/or Simulink® product family. As such, the graphical modeling and verification environment 120 may have all or a portion of the software components of MATLAB® and/or Simulink® installed on the computing device 102, or alternatively, accessible from another computing device on a network.

In FIG. 2A, although the graphical modeling tool 210 and verification tool 220 are illustrated as separate tools, one ordinarily skilled in the art will recognize and appreciate that these tools 210 and 220 may be combined into a single application, or otherwise tightly integrated to present a single application in performing the operations of the present invention as described. Additionally, although the executable form 225 is illustrated as external to the graphical modeling tool 210 and the verification tool 220 in FIG. 2A, the executable form 225 may also reside in and/or execute in the environments of either the graphical modeling tool 210 and/or the verification tool 220. For example, the executable form 225 may comprise an interpretative programming language that is executed in a run-time environment of either the graphical modeling tool 210 and/or the verification tool 220

Figure 2B:
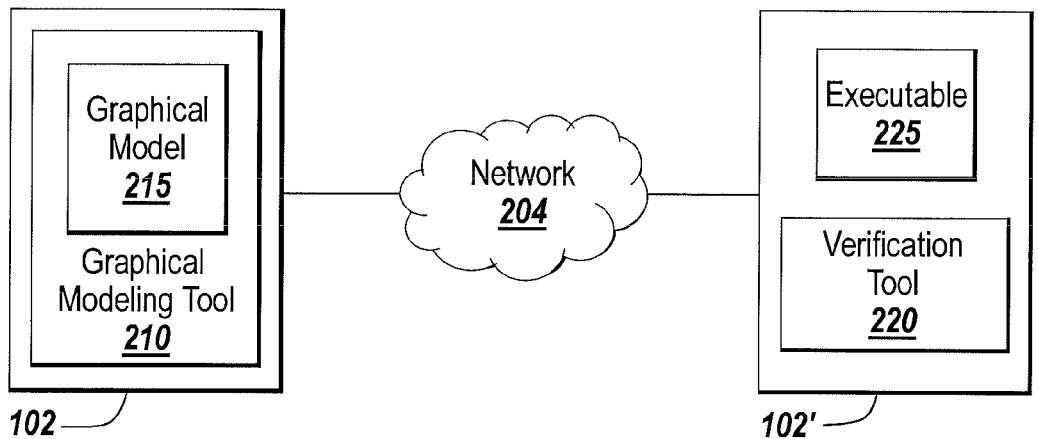
FIG. 2B is a block diagram of another illustrative graphical modeling and verification environment.

FIG. 2B depicts another environment, wherein portions of the functionality are distributed in a network environment. In a broad overview, a system 200 depicts a network 204 environment for running portions of the graphical modeling and verification environment 120 on multiple computing devices 102 and 102'. The system 200 includes multiple computing devices 102 and 102' connected to and communicating over a network 204. The network 204 can be a local area network (LAN), such as a company Intranet, a metropolitan area network (MAN), or a wide area network (WAN) such as the Internet. The network 204 may comprise separate networks, which may be of the same type or may be of different types. The topology of the network 204 over which the computing devices 102, 102', 102" communicate may be a bus, star, or ring network topology. The network 204 and network topology may be of any such network 204 or network topology capable of supporting the operations described herein.

The computing devices 102 and 102' can connect to the network 204 through a variety of connections including standard telephone lines, LAN or WAN links (e.g., T1, T3, 56 kb, X.25, SNA, DECNET), broadband connections (ISDN, Frame Relay, ATM, Gigabit Ethernet, Ethernet-over-SONET), cluster interconnections (Myrinet), peripheral component interconnections (PCI, PCI-X), and wireless connections, or some combination of any or all of the above. Connections can be established using a variety of communication protocols (e.g., TCP/IP, IPX, SPX, NetBIOS, Ethernet, ARCNET, Fiber Distributed Data Interface (FDDI), RS232, IEEE 802.11, IEEE 802.11a, IEEE 802.11b, IEEE 802.11g, and direct asynchronous connections).

The network 204 and network connections may include any transmission medium between any of the computing devices 102 and 102' such as electrical wiring or cabling, fiber optics, electromagnetic radiation or via any other form of transmission medium capable of supporting the operations of the present invention described herein.

Each of the computing devices 102 and 102' may be configured to and capable of running any portion of the graphical modeling and verification environment 120. The graphical modeling and verification environment 120 and/or any portion thereof, such as the graphical modeling tool 210 and the verification tool 220, can be capable of and configured to operate on the operating system that may be running on any of the computing devices 102 and 102'. Each computing device 102 and 102' can be running the same or different operating systems. Additionally, the graphical modeling tool 210 and the verification tool 220 can be capable of and configured to operate on and take advantage of different processors of any of the computing devices 102 and 102'. Various combinations of operating systems and processors can be running on any of the computing devices.

Figure 2C:
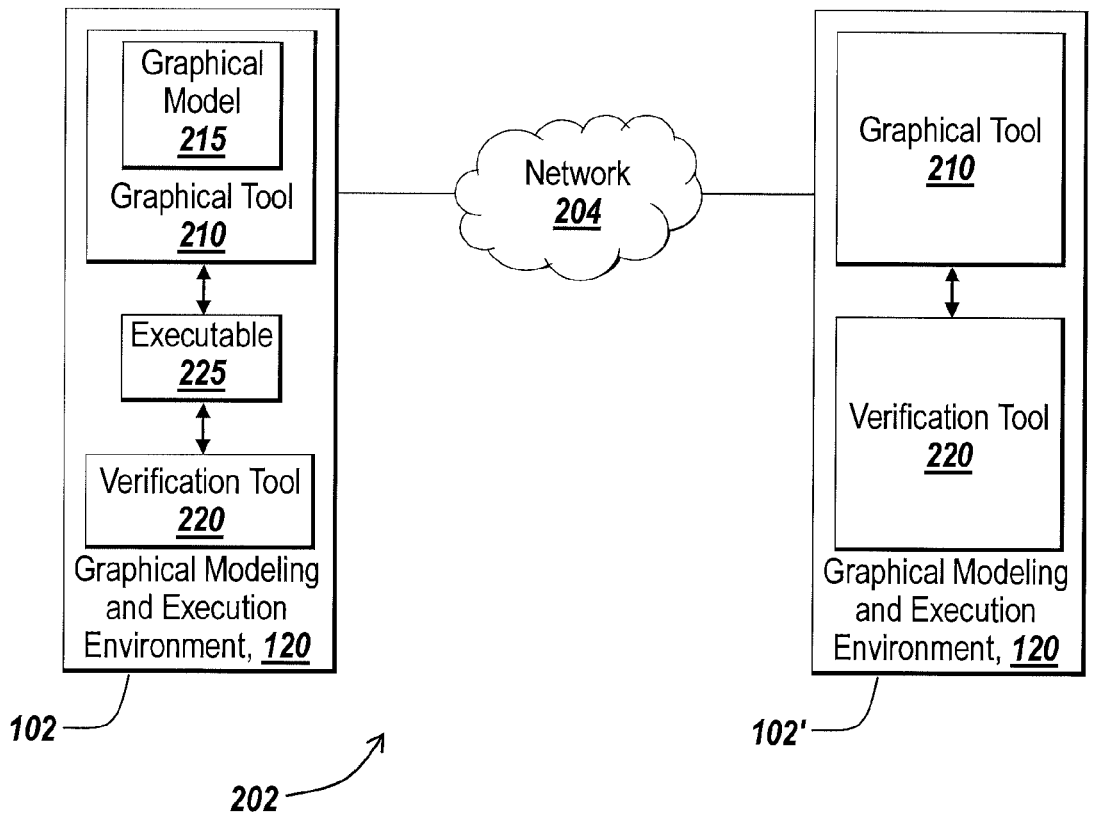
FIG. 2C is a block diagram of another illustrative graphical modeling and verification environment.

FIG. 2C depicts another exemplary environment, wherein portions of the functionality described herein are present in a client/server architecture in a network environment. In a broad overview, the illustrative graphical modeling and verification environment 120 includes a client computing device 102 connected to and in communication with a server computing device 102' over a network 204. The graphical modeling tool 210 and/or the verification tool 220 can be capable of and configured to have respective portions run on each of the client 102 and the server 102'. In one embodiment, the graphical modeling tool 210 may have a first portion running on the client 102 and a second portion 210' running on the server. For example, the graphical modeling tool 210 may have a client portion 210 on the client 102 for providing and displaying the graphical model 215, and a server portion 210' on the server 102' that may include application functionality and other processing, such as storing and/or retrieving portions of the graphical model 215 from a database. Likewise, the verification tool 220 may also have a client portion 220 and a server portion 220'. The graphical modeling tool 210 and/or verification tool 220 may be capable of and configured to execute with a client portion and a server portion in a client/server architecture.

Additionally, the graphical modeling tool 210 and/or verification tool 220 may be deployed such that portions of the graphical model 215 and/or the executable 225 may execute on certain portions of the network 204 and/or on certain computing devices 102 or 102'. For example, some functionality of the graphical model 215 may be time critical or sensitive, and therefore may be targeted to execute on a computing device 102 and 102' and a segment or portion of the network 204 with desired performance and/or operating characteristics. Other functionality of the graphical model 215 may be less time-sensitive and may be targeted to be deployed to any computing device 102, 102' available on the network 204.

In summary, the graphical modeling tool 210 and verification tool 220 may be deployed across a wide range of different computing devices, different operating systems, and different processors. Furthermore, the graphical modeling tool 210 and verification tool 220 may be deployed in various distributed and/or client/server environments in various network topologies and configurations.

Preconditions and Postconditions

Figure 3A:
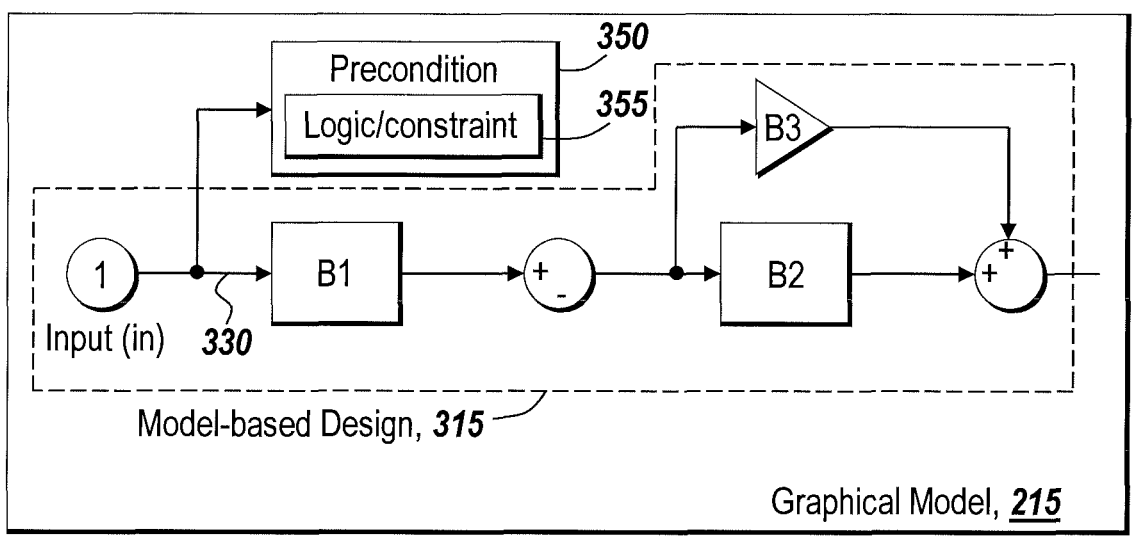
FIG. 3A is a diagrammatic view of an illustrative graphical model and precondition design element.

A design element in the graphical model may be provided to represent a precondition for testing or verification of the model-based design represented by the graphical model 215. FIG. 3A depicts an illustrative graphical model 215 having a model-based design 315 and an element 350 in the graphical model 215 representing and identifying a precondition. The element 350 may also be referred to as a precondition element, a precondition design element, a test precondition item, or a verification precondition item. The model-based design 315 portion of the graphical model 215 represents a design of a system, or other item or entity, which may be under design, test, or verification. For example, the model-based design 315 may be a block diagram model provided by the graphical modeling tool 210 of Simulink®. The model-based design 315 may also be referred to as the design. From another perspective, the model-based design 315 portion of the graphical model 215 is the content of the graphical model 215 prior to adding any precondition element 350.

The precondition design element 350 provides a design mechanism and formalism for identifying and specifying a precondition associated with the model-based design 315 of the graphical model 215. The precondition design element 350 is directed towards indicating to a testing or verification tool, or any other system, a precondition for executing a test, verification, or simulation of the model-based design 315, such as via an executable form 225. In one aspect, a precondition may not be intended to affect the behavior of the design 315 of the graphical model 215 but to provide limits or constraints to the inputs of executing the design, or to provide limits or constraints to the execution space of the design under test or verification. The precondition design element 250 is depicted in FIG. 3A as separate and external to the model-based design 250 to illustrate that the precondition design element 240 is a design element used to associate a precondition with a model-based design 315 without affecting, altering, or otherwise being intrusive to the behavior of the model-based design 315. Although shown external to the model-based design 315 for illustrative purposes, as will be discussed later, the precondition design element 350 may be incorporated into the model-based design 315, or any element thereof, in a manner that does not affect the behavior of the model-based design 315. For example, the graphical modeling tool 210 may provide a simulation environment for simulating the graphical model 215. When simulating the graphical model 215, the graphical modeling tool 210 may ignore or otherwise not consider or use the precondition design element 350 for simulating the graphical model 215.

A precondition may be considered a condition or a constraint that should be established during or prior to invoking execution of the executable form 225 of the design 315. That is, the condition or constraint of the precondition provides a limit to the design and verification process by restricting possible occurrences or allowable combinations of execution scenarios. In another aspect, a precondition may also be considered a business rule or a caveat that places a condition or a constraint on inputs, actions, decisions variables, and scenarios to be executed in verification of the design 315. Additionally, a precondition may be considered from a mathematics perspective. As such, a precondition may provide a constraint which restricts the possible, feasible, or more realistic solutions in an optimization problem. In a further aspect, the precondition may be considered from a theory of constraints perspective in that a precondition provides any factor that limits the performance or behavior of a system, such as one modeled by the design 315, with respect to the system's goal or intended use. The precondition design element 350 of the present invention generally provides an instruction or directive for a test or verification system, such as the verification tool 220, for performing a test or verification on the executable form 225 of the design 315.

Figure 3B:
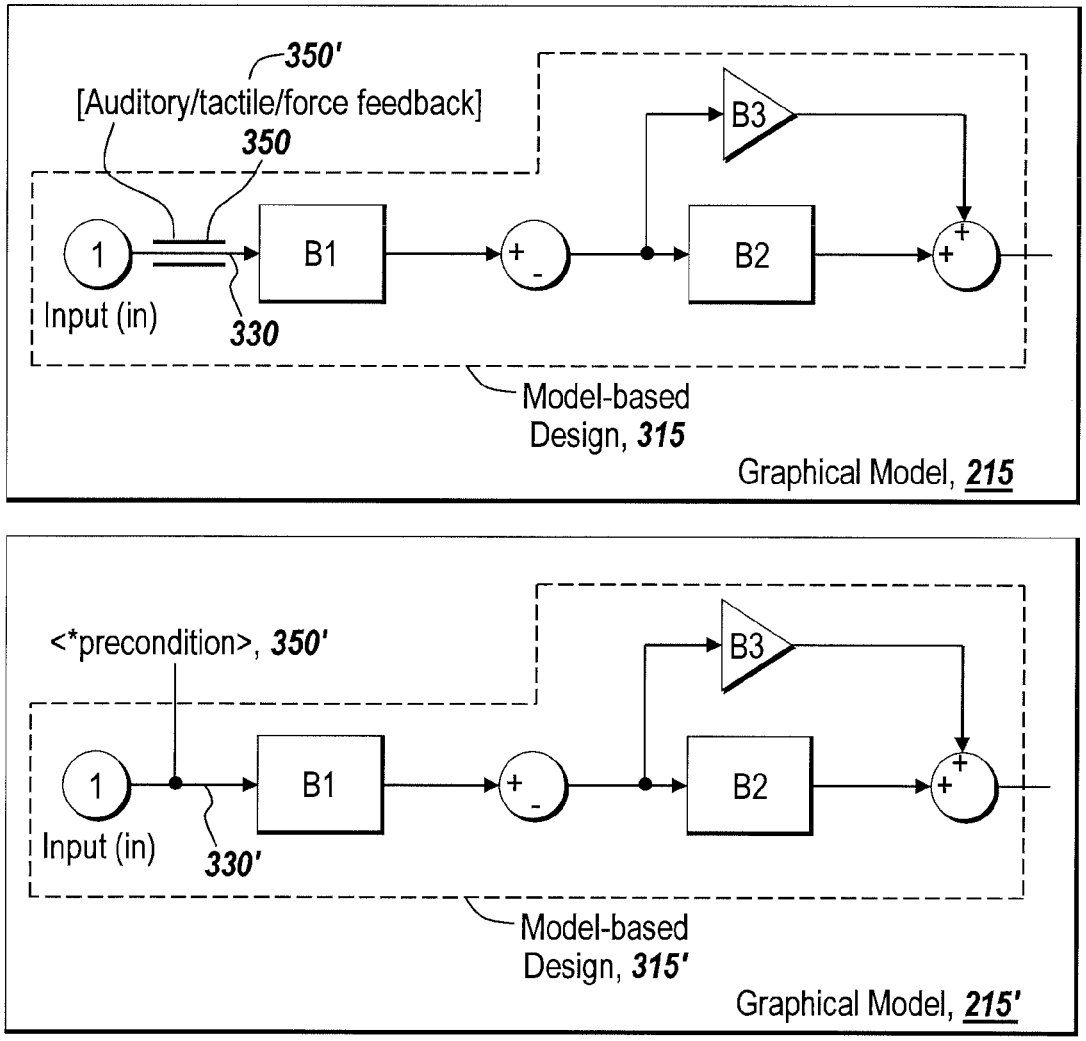
FIG. 3B is a diagrammatic view of an illustrative graphical model and the precondition design element.

The precondition design element 350 may comprise any type and/or form of a textual or graphical element that can be associated with a graphical model 215 or any portion of the model-based design 315. The precondition design element 350 may be a graphical element or construct, such as a precondition block of a block diagram model, or an icon, image, or other graphical form. The precondition design element 350 may provide a visual cue and comprise a highlight, a border, an animation, a change in color or font, an asterisk, an element shimmer, or any other type and/or form of a visual cue. By way of example, the precondition design element 350 associated with graphical model 215 of FIG. 3B illustrates a visual cue such as a board or highlight. The precondition design element 350 for graphical model 215 may be any type and/or form of visual cue The precondition design element 350 may also be associated with any auditory, tactile or force-feedback cues, such as any sound produce-able from the computing device 102 or any sensory output produce-able from a haptic or touch feedback device of the computing device 102. For example, the precondition design element 350' for graphical model 215 of FIG. 3B may include an auditory, tactile, and/or force feedback cue either alone or in combination with the precondition design element 350 that may be provided in a visual cue, graphical, or textual form. Additionally, the precondition design element 350 like the precondition design element 350 may be associated with a model element, such as the signal input 330 of the model-based design 315 as illustrated in the graphical model 215 of FIG. 3B.

Referring still to FIG. 3B, the precondition design element 350' may comprise a textual representation, such as illustrated with graphical model 215. In one case, the precondition design element 350 may comprise and be identified by any alphanumeric characters associated with an element of the model-based design 315. By way of example, the precondition design element 350' for graphical model 215' is illustrated as text "<*precondition>" associated with the signal input 330 of the model-based design 315'. In other cases, the precondition design element 305 may be represented and comprise a portion of an element of the model-based design 315, such as a textual representation, indicator or configuration of the element of the model-based design. For example, a signal line in a block diagram model 215 may be configured to include a precondition. As such, the signal line may include textual information in the signal's configuration that represents or identifies the precondition as discussed in more detail in conjunction with FIG. 3E below. Additionally, a textual indicator associated with an element of the model-based design 315, such as the signal line, may be visually depicted in the graphical model 215. Furthermore, the precondition design element 350 may comprise any combination of textual or graphical representation that may or may not be visible in the graphical model 215.

The precondition design element 350 may also include or be associated with information of logic or a constraint 355 to identify, define, specify, reference, or otherwise provide the definition, specification, or instruction of the precondition. The constraint 255 may be created, defined, specified, or otherwise provided by any type and/or form of graphical or textual expression. The precondition design element 350 may provide pre-determined or fixed set of constraint 355 information. For example, the graphical modeling tool 210 may provide a library of precondition design elements 355 that provide one or more constraints based on any operating, performance, modeling, system, environment, or other constraints known for a specific domain or system or for a component of the design 315 under consideration. In another example, the precondition design element 350 may provide a pre-determined or fixed constraint 355 that is further configurable or changeable. In this manner, the precondition design element 350 may provide a template for a constraint 355 to be used as is or to be further modified for the desired use.

The precondition design element 305 may be configurable to allow the constraint 355 to be defined or provided either programmatically via any application programming interface (API) or by a user via an input device. In one embodiment, the precondition design element 350 may provide or include a configuration mechanism, such as graphical user interface or command line interface, for receiving user input or selections for defining the constraint of the precondition. For example, the user interface may provide a list of one or more business rules for selection in defining the precondition of the precondition design element 350. Additionally, in some embodiments, the precondition design element 350 may be configurable to be set to or changed to an active or inactive state. Instead of removing precondition design elements 350 that may not be desired to be used in certain cases, the precondition design element 350 may remain associated with the model-based design 315 but not used.

The constraint 355 of the precondition design element 350 may be expressed or specified in any type and/or form of graphical or textual language. In embodiments employing Simulink® and Stateflow®, the constraint 355 may be defined using any function, API, language statement, block, state diagram element, graphical construct, and/or graphical function provided by the graphical modeling tool 210. The constraint 355 may be specified using the high-level textual programming language of MATLAB®. In another embodiment, the constraint 355 may be specified in a language or in a format used by the verification tool 220. For example, the constraint 355 may be specified textually as a string to include text in a format or syntax known by or understandable by the verification tool 220. Any type and/or form of graphical or textual instruction, including interpretive or non-interpretive programming languages, markup languages such as the HyperText Markup Language, scripting languages, or a custom syntax and language may be used in providing the constraint 355 of the present invention.

Additionally, the constraint 355 may be expressed as any type and/or form of logic or conditional to provide the desired precondition constraint. The constraint 355 may be specified as a value or range of values to set an input, parameter, argument, variable, property, attribute, or other settable data element related to the model-based design 315 or the execution of the model-based design 315 in execution form 225. The value or range of values may include any data type, such as a Boolean, string, integer, binary, array, real or complex number, data structure, object, scalar and/or vector, of any size and/or dimension. Also, the value or range of values may be specified in an inclusive or exclusive manner. For example, a constraint 355 for a signal input of a block diagram model 215 may be specified that it should be equal to a value or range of values, e.g., inclusive manner, or should not be set to a value or range of values, e.g., an exclusive manner. The constraint 355 may also be expressed as conditional logic where a value of a data element of the model-based design 315 is set or changed based on the state, status, or value of another data element of the model-based design 315. For example, the constraint 355 may be expressed as an if-then, if-then-else, or any other type of if, case, select or logic conditional statement.

Figure 3C:
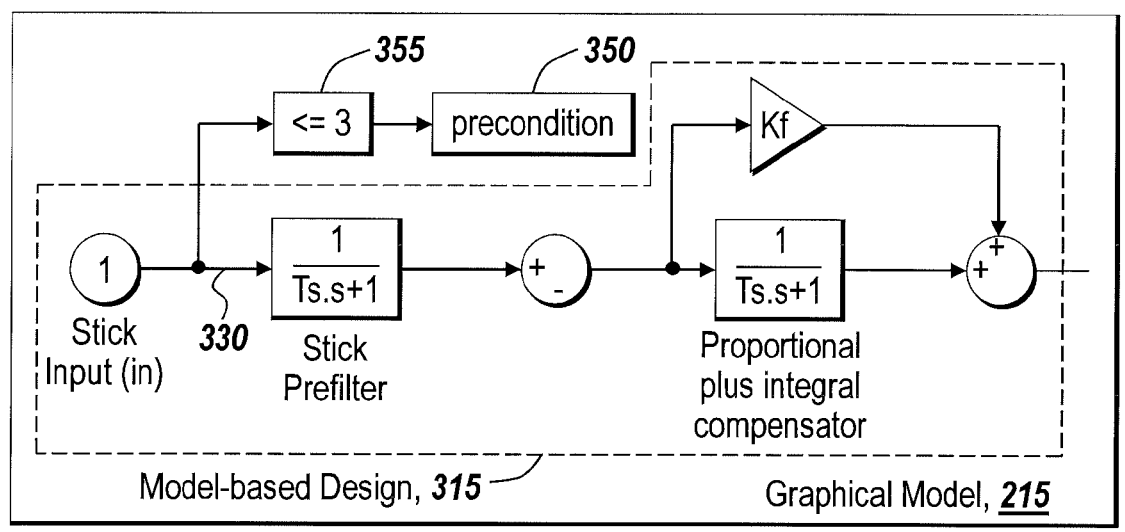
FIG. 3C is a diagrammatic view of another illustrative graphical model and precondition design element.

Referring now to FIG. 3C, an illustrative precondition design element 350 is depicted with an illustrative model-based design 315 of a graphical model 215. The model-based design 315 of FIG. 3C depicts a graphical model 215 in the form of a block diagram model, such as a model provided by Simulink®, including multiple functional blocks connected together via signal lines as known by those ordinarily skilled in the art. A precondition design element 350 and constraint 355 may be associated with an element of the model-based design 315. In the illustrated example, the precondition is associated with the initial input signal 330 of the design 315. The constraint 355 of "<=3" indicates a precondition that the design 315 is to be constrained or concerned with only values of the input signal 330 less than or equal to 3 in whatever units are relevant to the input 330 or the design 315. The precondition 350 and constraint 355 provide an instruction to a verification tool 220 that may execute an executable form 225 of the design 315 to perform verification executions only with input values of less than or equal to 3. In this manner, the verification of the design 315 would be constrained to the possible occurrences of input values of less than or equal to three instead of all possible combinations of input values. Also, in some embodiments, if the graphical modeling tool 210 performs simulation of the design 315, the graphical modeling tool 220 may ignore the precondition and allow or simulate with any value for the input signal 330.

As illustrated in FIG. 3C, the precondition design element 350 may be separated into multiple elements or constructs, graphical or textual, having a portion representing an identifier of a precondition 350 and a portion specifying the constraint 355. Additionally, one or more constraints 355 may be specified for a single precondition element 350. The one or more constraints 355 may be applied in combination as a logical conditional for the precondition element 355 by, for example, via a logical OR or AND function. For example, one constraint 355 may be exclusively OR'd with another constraint 355 to provide a resulting constraint for the precondition. A constraint 355 may be associated or used with multiple precondition elements 350. Although FIG. 3C illustrates separated parts of the precondition design element 350, one or more constraints 355 may form and be included or otherwise incorporated in a single precondition design element 350. The precondition design element 350 and constraint 355 may take many visual, textual and/or configurable forms in practicing the operations of the present invention as described herein.

Although the precondition design element 350 is depicted in FIG. 3C as associated with a signal input 330 of the design 315, the precondition design element 350 may be associated with any portion or element of the design 315. The precondition design element 350 may be associated with or provide a precondition for any element of the graphical model 315 in the terms and granularity of the graphical model 215 as may be provided by the graphical modeling tool 210. For example, in the exemplary case of Simulink® and/or Stateflow®, the precondition design element 350 may be provided for any signal, block, state, object, and any other element used to provide a design 315. Likewise, the constraint 355 of the precondition design element 355 may use or reference any data element accessible via the graphical model 215 or graphical modeling tool 210. For example, in the exemplary case of Simulink® and/or Stateflow®, the constraint 355 may use or reference any signal value, signal attribute, MATLAB® workspace variable, function, parameter, argument, application programming interface (API), object property, block data element, state diagram element, or any other data element available in Simulink® and/or Stateflow®. The precondition design element 350 and constraint 350 may be applied in a manner relevant to the context, terms, elements, design, and environment provided by the graphical model 215 and/or graphical modeling tool 210.

Figure 3D:
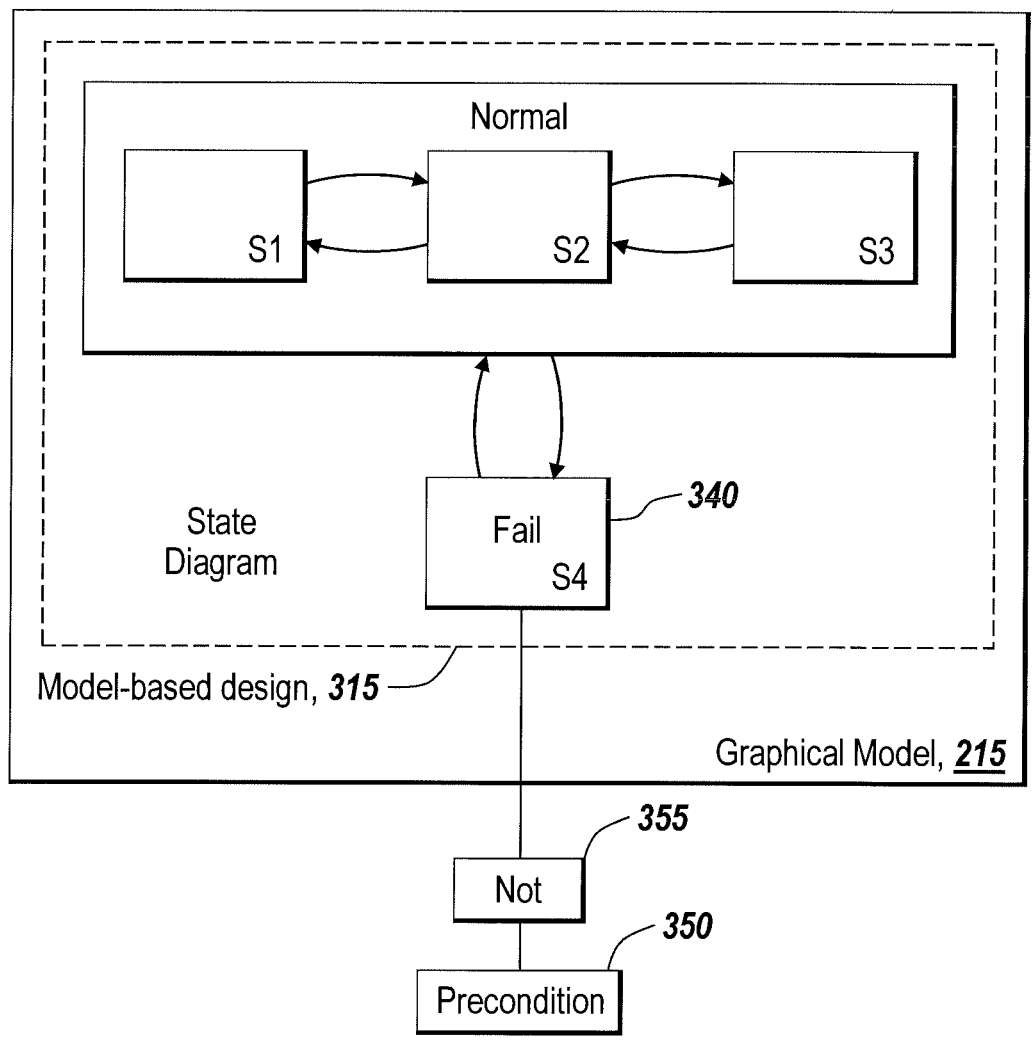
FIG. 3D is a diagrammatic view of an illustrative precondition design element and a graphical model representing a state machine.

FIG. 3D depicts another illustrative precondition design element 350 with another illustrative model-based design 315 of a graphical model 215. The model-based design 315 of FIG. 3D depicts a graphical model 215 in the form of a state diagram model, such as a state diagram model provided by Stateflow® with Simulink®, including multiple state blocks connected together via transitions as known by those ordinarily skilled in the art. A precondition design element 350 and constraint 355 may be associated with a state of the state diagram model 315. In the illustrated example, the precondition 350 is associated with the fail state 340. The constraint 355 may be expressed as any type of Boolean conditional, such as a "NOT" expression, and may use or reference any data element of the fail state 340 that represents or provides a value or state of the fail state 340. In this manner, the precondition design element 350 may indicate to a verification tool 220 to constrain, limit, or restrict the verification to only consider scenarios where the state diagram model 315 does not transition to the fail state 340. For example, the designer of the state diagram model 315 may want to explore and verify design scenarios that do not cause the design 315 to fail.

Figure 3E:
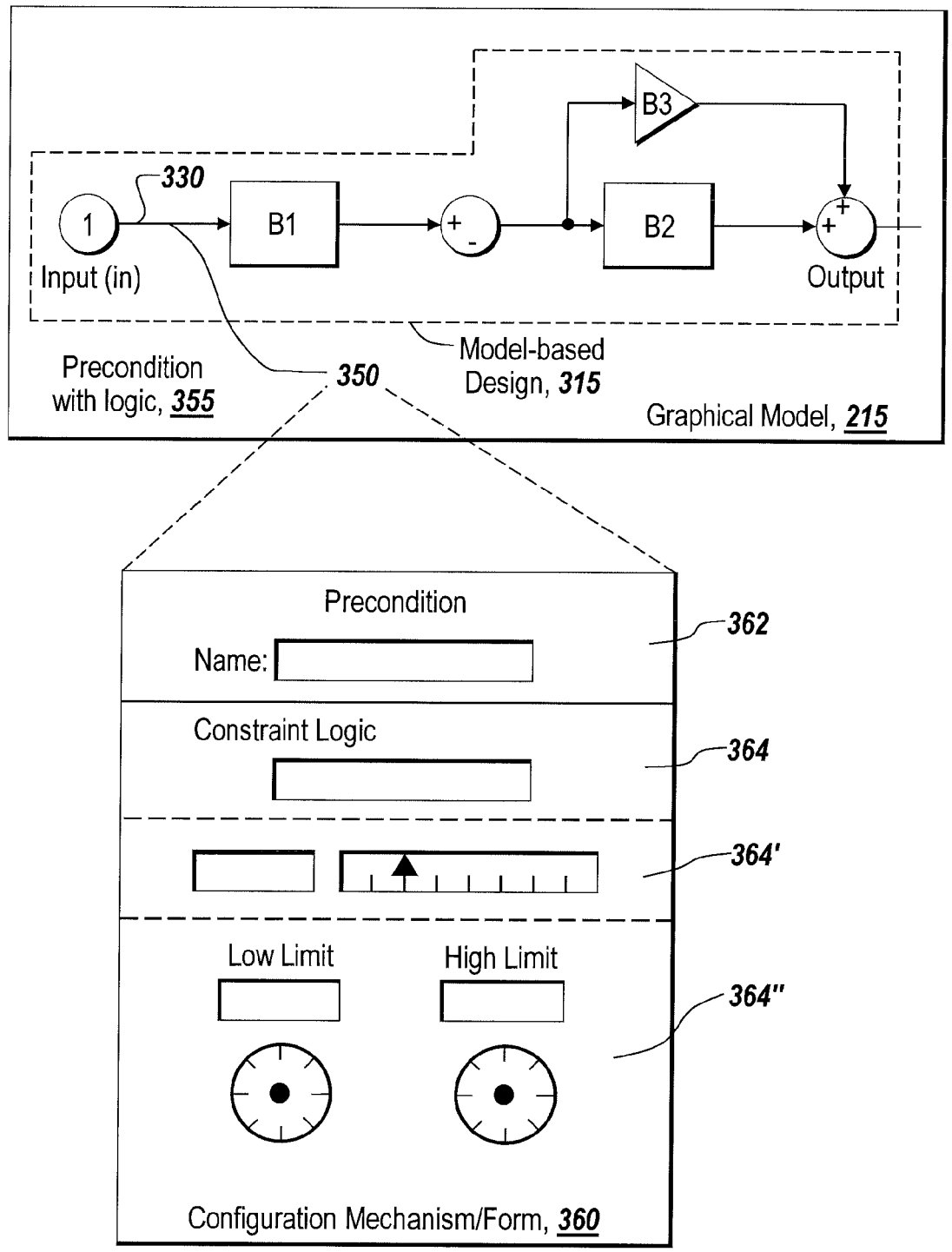
FIG. 3E is a diagrammatic view of an illustrative configuration mechanism for a precondition design element.

FIG. 3E illustrates another embodiment of the precondition design element 350. In this embodiment, the precondition design element 350 is incorporated as a configuration of an element or a portion of the design 315 of the graphical model 215. By way of example, FIG. 3E depicts a precondition design element 350 associated with a signal 330 of a block diagram model 215. As illustrated, the precondition design element 350 may not be a separate element or construct of the model 215 but instead may be data or information configured or associated with a model element. A configuration mechanism such as a graphical user interface 360 may be used to identify the precondition 350 and specify the constraint 355. In other embodiments, a command line interface or application programming interface (API) may be used to provide a precondition design element 350 and/or constraint 355.

By way of example, the configuration mechanism 360 of a user interface illustrated in FIG. 3E may provide any suitable means and/or mechanisms for identifying a precondition 350 and/or specifying a constraint 355. For example, the user interface 360 may provide a text field 362, or any other suitable user interface element, for specifying a name or identifier of the precondition 350. For specifying the constraint 355, the user interface 360 may provide an input element 364, such as a text field or edit box, to allow a user to enter in free form any expression of the constraint 355. In one embodiment, the user interface 360 may provide a slider element 364' for selecting a value for the signal 330. The slider element 364' may allow a single value to be selected or a range of values to be selected. In another embodiment, the user interface 360 may provide user interface elements 364" to present a dial mechanism to select one or more values for a precondition constraint of the signal 330. For example, a first dial may be used to select or provide a low limit and a second dial may be used to select or provide a high limit for a range of values for the constraint 355. Although the configuration mechanism 360 is illustrated with a certain set of user interface element 362, 364, 364' and 364", any type and/or form of user interface elements, graphical or textual, may be used to configure a precondition 350 and constraint 355.

Figure 3F:
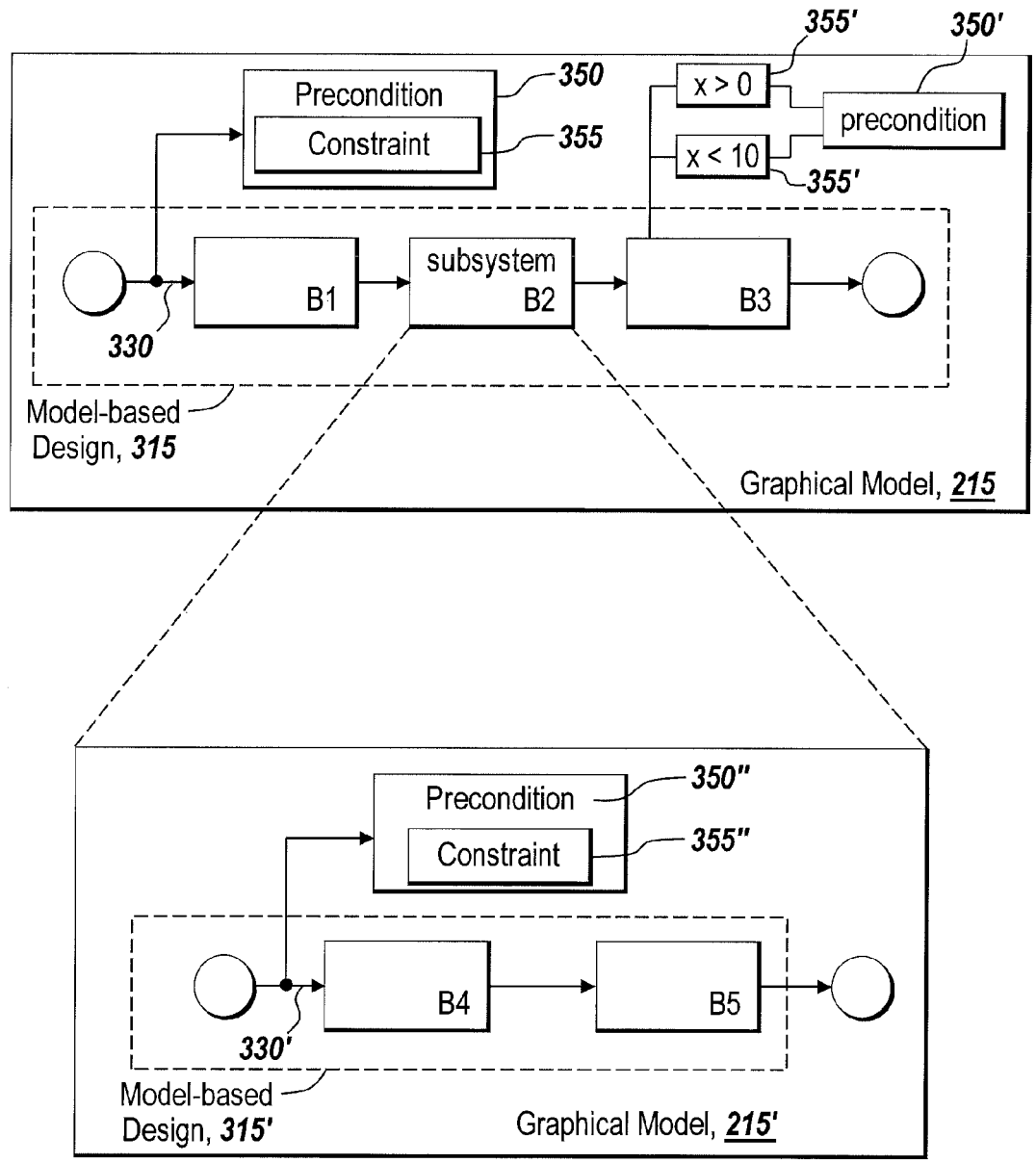
FIG. 3F is a diagrammatic view of an illustrative hierarchical graphical model with multiple precondition design elements.

Referring now to FIG. 3F, a hierarchical graphical model 215 with multiple precondition design elements 350 is depicted in another exemplary embodiment. A precondition design element 350 may be associated with different elements or portions of the design 315 and at different hierarchical levels of the design 315. The illustrative graphical model 215 of FIG. 3F is a multiple-block block diagram model with one of the blocks B2 providing or referencing a sub-system or another graphical model 215'. At the first level of the graphical model 215, a first precondition design element 350 is provided for the input signal 300 and a second precondition design element 350 is provided for the block B3 of the design 315. As illustrated in FIG. 3F, the first precondition design element 350 may be a single construct while the second precondition design element 350' is a multiple element construct. The second precondition design element 350' may include multiple constraints 355' logically combined to provide a constraint for the precondition design element 350'. For example, the value range for a data element of block B2 may be specified as a value greater than 0 logically AND'd with a value less than 10. At the second hierarchical level of the graphical model 215, the graphical model 215' provides a sub-system of the design 315 via block B, and a third precondition design element 350" is provided for the input signal 330' of the design 315'.

Although not illustrated in FIG. 3F, the precondition design element 350 of FIG. 3E may also be deployed in the multiple precondition design element and hierarchical graphical model embodiment of FIG. 3E. Additionally, any one or more of the precondition design elements 350, 350', and 350" may be configured to be active or inactive. This provides the designer the configurability to provide and use different precondition design elements 350, 350' and 350' in combination or alone. For example, the designer may not be concerned with the verification of the sub-system or second hierarchy of graphical model 215 and therefore set the third precondition design element 350" to an inactive or off state. In this manner, a verification tool 220 may not consider the third precondition design element 350" when performing verification.

Although in FIGS. 3A-3F, the precondition design element 350 is illustrated as part of and included in the graphical model 215, the precondition design element 350 may be provided external to but in association with the graphical model 215 or the design 315 of the graphical model 215. In some embodiments, the precondition design element 350 may be identified and/or the constraint 355 specified in an external storage location, such as a file, a library, another software program or set of executable instructions, or any other computer readable medium or storage location. In other embodiments, the precondition design element 350 may be defined in an input file for a code generation process so that the precondition design element 350 may be provided in association with the executable form 225 of the design. The precondition design element 350 of the present invention may be specified externally to the graphical model 215 by other suitable means and/or mechanisms and in other environments.

Figure 4:
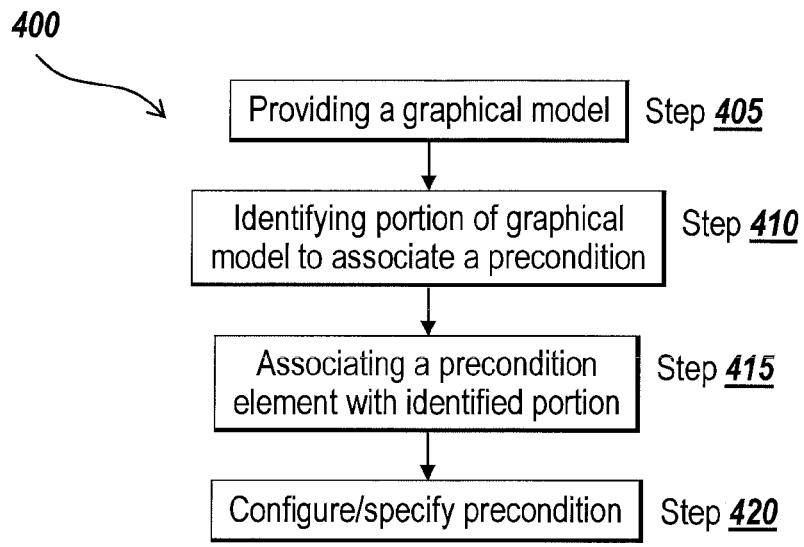
FIG. 4 is a flow diagram depicting an illustrative method for configuring and/or specifying a precondition.

FIG. 4 depicts an illustrative method 400 of practicing the technique of using a precondition design element 350. At step 405 of illustrative method 400, a graphical model 215 is provided, such as any of the graphical models 215 of FIG. 3A-3F. The graphical model 215 may be created, designed, edited, or otherwise provided by a graphical modeling tool 210 such as in a modeling environment of Simulink® and Stateflow®.

At step 410 of illustrative method 400, a portion of the design 315 of the graphical model 215 is identified for associating a precondition. For example, a designer or modeler of the design 315 may determine which elements and functionality of the system under test to provide a precondition. A precondition may be associated with the design 315 for a variety of reasons and purposes as one ordinarily skilled in the art would appreciate. Additionally, the portion of the graphical model 215 associated with a precondition may be based on the context and environment of the system, the desired behavior, the intended use or goal of the system, and the desire of the designer. In some embodiments, the precondition design element may be used to 1) constrain the behavior of a design under test or verification to those patterns that may be more meaningful in the larger context of the design being analyzed, 2) force execution patterns to be more realistic in the context of the system and the system's environment, 3) improve the performance of automated verification techniques by reducing the execution space that must be explored or executed, and/or 4) perform guided design exploration through the use of formal analysis or test generation. The precondition design element 350 may be used to provide any type and/or form of condition, instruction, command, or directive to a testing or verification tool, or to another system or environment, to use or execute the design 315 in executable form 225 in a desired manner.

At step 415 of illustrative method 400, a precondition design element 350 is provided and associated with the identified or otherwise desired portion of the design 315 represented by the graphical model 215. The graphical modeling tool 210 provides any type and/or form of suitable means and/or mechanism for creating, identifying, designing, configuring, specifying, or otherwise providing a precondition design element 350. In some embodiments, the graphical modeling tool 210 provides a toolbox or palette for dragging and dropping or otherwise placing a precondition design element 350 in the design layout area for the graphical model 215. A precondition design element 350 may be associated with a portion of the design by either a physical connection in the design 350 or by a logical or virtual association. In some embodiments, the precondition design element 350 is connected via a line or other suitable connector or graphical element to the identified portion of the design 315. For example, a precondition design element 350 may be connected to a signal line, a block, or a state of a block diagram model 215. In other embodiments, the association between the precondition design element 350 and the portion of the design 315 may be formed via a reference or identifier in the configuration of the precondition design element 350 to the desired portion of the design 315. Various means and/or mechanisms may be used to associate a precondition design element 350 with a portion of the design 315.

Additionally, illustrative steps 410 and 415 may be repeated as desired to associate one or more precondition design elements 350 with different portions of the design 315 of the graphical model 215. Furthermore, steps 410 and 415 may be performed at one or more levels of hierarchy that may be provided by the graphical model 215.

At step 420 of illustrative method 400, the precondition design element 350 may be configured to provide the desired precondition. The graphical modeling tool 210 may provide any type and/or form of suitable configuration mechanism, such as the user interface 350 illustrated in FIG. 3E, to configure the precondition design element 350. In other embodiments, a pre-configured or fixed-functionality precondition design element 350 may be used. A template or pre-configured precondition design element 350 may be provided and further configured or modified as desired using any suitable configuration mechanism. In configuring the precondition design element 350 at illustrative step 420, the constraint 350 may be defined or specified to provide the desired constraint using any graphical or textual form, syntax, or language as previously discussed in connection with FIG. 3A. Additionally, in practicing the operations of the present invention and illustrative method 400 as described herein, any one or more precondition design elements 305 may be configured to be active or inactive as may be desired during the design, test, and verification process.

Figure 5A:
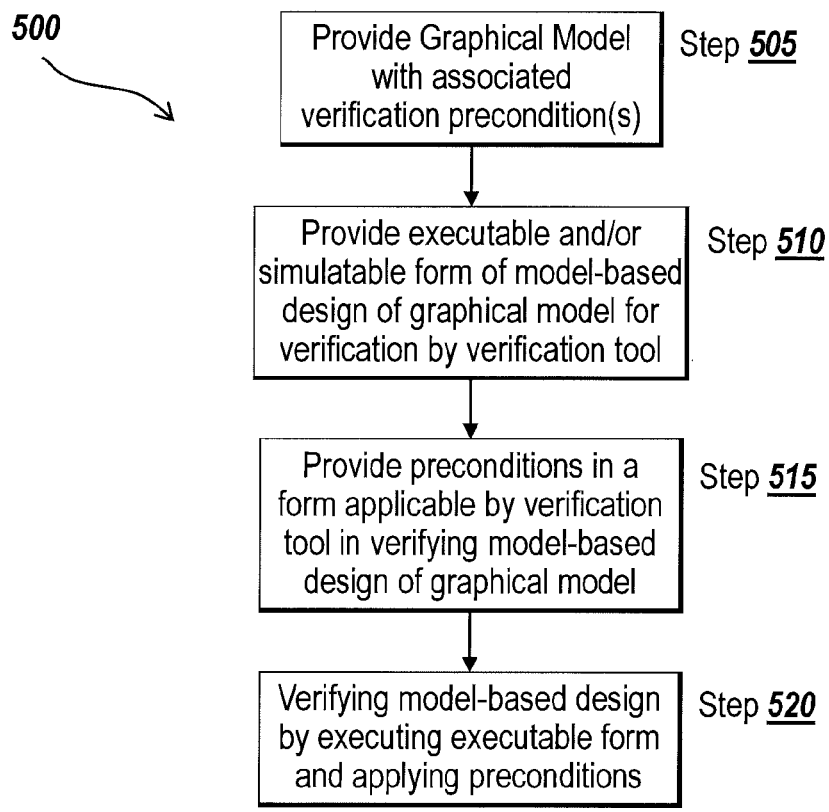
FIG. 5A is a flow diagram depicting an illustrative method for generating an executable for verification from an illustrative graphical model.
Figure 5B:
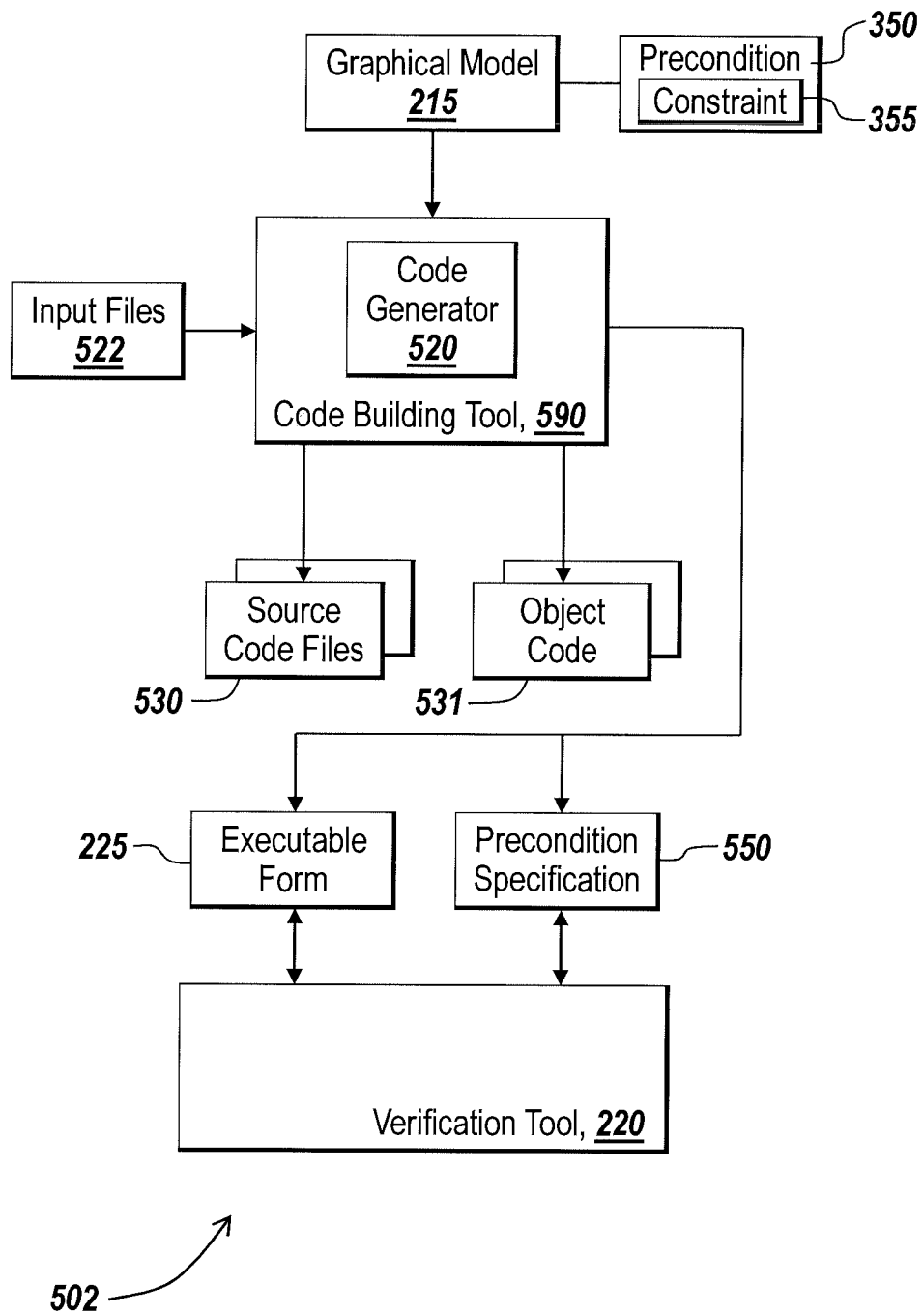
FIG. 5B is a block diagram of an illustrative executable generation system.

An illustrative method 500 of FIG. 5A and system 502 of FIG. 5B of the present invention will be used to discuss the operations, functions, and structure of the code generation techniques. Referring to FIG. 5B, in brief overview, the code generating system 502 comprises a code building tool 590 having a code generator 520. The code building tool 590 may comprise the Stateflow® Coder and Real-Time Workshop® products both manufactured by The MathWorks, Inc.

Referring to FIG. 5A, the illustrative method 500 obtains a graphical model 215. The graphical model 215 may include one or more precondition design elements 350. In some embodiments, the graphical model 215 may be obtained via a file. The graphical model 215 may comprise a file in a format that the code building tool 590 or code generator 520 can read and that follows a file specification for defining precondition design elements 350 or for otherwise referencing a precondition design element 350. In some embodiments, the precondition design element 350 is included with or is a part of the graphical model 215. In other embodiments, the precondition design element 350 may be referenced by or associated with the graphical model 215 but provided by a file or medium external or separate from the graphical model 215. In these cases, in providing the graphical model 215 at illustrative step 505, any other files or resources needed to perform the code generation process as described herein may also be provided.

The code building tool 590 and/or code generator 520 may obtain either the graphical model 215 from an application programming interface (API) call to another application or via an interface to another environment, such as the graphical modeling tool 210. In yet a further embodiment, the graphical modeling tool 210 or another computer program saves and converts the graphical model 215 into a format readable by the code building tool 590. For example, a graphical model 215 produced with Simulink® and Stateflow® may be converted into an intermediate model file representation such as an .rtw type file readable by the automatic code generator of Real-Time Workshop®.

At step 510 of illustrative method 500, an executable or simulateable form 225 of the model-based design 315 of the graphical model 215 is provided or generated and built for verification by a verification tool 220. The code building tool 190, such as Stateflow® Coder and/or Real-Time Workshop®, may generate code for the graphical model 215. The code building tool 590 and code generator 520 use one or more input files 522 in conjunction with reading and processing the graphical model 215.

The one or more input files 522 may comprise files including templates, commands, input parameters, configuration data, source code, data and class definitions, component configuration, device driver or any other information that may be used by the code generator 520 to generate code for the graphical model 215. The input files 522 may include files to provide input to and configure the code generator 520 to generate source code files 530 for a specific target hardware platform, for example, a specific processor. In an exemplary embodiment of Real-Time Workshop® as the code generator 520, Real-Time Workshop® uses target language compiler script files, with a .tlc file extension, as input files 522 to the code generation process. The .tlc files provide sections of programming instructions to be implemented for block and element references as they may be found in the graphical model 215 during the code generation process. The .tlc files also can provide data and class definitions for data element references found in the graphical model 215. Furthermore, the .tlc files may provide data and other information to translate precondition design elements 350 associated with the graphical model 215 into precondition specifications 550 to be used by the verification tool 220 or the target system. Additionally, the .tlc files also comprise compiler directives, built-in functions, and other code generation commands to direct Real-Time Workshop® during the code generation process.

In operation, the code generator 520 reads in information regarding or a representation of the graphical model 215 and uses the input files 522 to generate code by translating the graphical model 215 into one or more source code files 530. By way of example, the automatic code generation can be discussed in terms of generating code with Real-Time Workshop® from a block model diagram 215 generated with Simulink®. Simulink® creates and stores block diagram models 215 into model files with an .mdl file extension. As part of the code generation process, Real-Time Workshop® reads in an .mdl model file and analyzes the model to generate an intermediate model file with an .rtw extension. This intermediate .rtw model file comprises a hierarchical structure of records describing systems and their blocks and connections analyzed from a block diagram model 215 of the .mdl file.

A language compiler called the target language compiler of Real-Time Workshop® works with .tlc files and .rtw files to produce code. The target language compiler interprets a program that reads the intermediate model file description of an .rtw file. As the target language compiler encounter a record in the .rtw file, it uses directives in the .tlc files corresponding to the record to direct the code generation process for the specific record. As such, the target language compiler works much like a text processor. For example, the target language compiler uses block .tlc files, which specify the particular code for a block, to transform each block into code. When it reads a record in the .rtw file that references a block, the target language compiler applies code from the corresponding block .tlc file to generate code for the block in source code files 522. Additionally, model wide .tlc files are also used to provide input to the target language compiler for global customization of the code. Model wide .tlc files may direct the target language compiler to generate main routines to provide entry points into the program, source code header files to setup data structures, and utility functions to support code for particular blocks. The block and model wide .tlc files can be modified to generate customized code for blocks and to generate any desired global customizations to the code.

The source code files 530 generated from the code generator 520, such as Real-Time Workshop®, may comprise program instructions of a programming language, such as C, which may further be in a format and style following the ANSI/ISO C standard. Additionally, the source code files 530 may be generated to comprise fixed-point or floating-point source code. The programming instructions of the source code files 530 may be generated to run on any real-time operating system or for a specific processor. In a further embodiment, the programming instructions of the source code files 530 may be optimized for performance or versatility, and/or for a specific target hardware platform. In another embodiment, the code generator 520 can be configured via the input files 522 to generate custom source code comprising a style and format as directed by the input files 522. The code generator 520 can be also configured via the input files 522 to provide customized source code to support such customizations as error handling, optimization, code and data reduction, code reusability, scoping of variables, and other characteristics of the source code that may be modified during the source code generation process.

A portion of the source code 530 or object code 531 generated or provided by illustrative method 500 may be targeted to run on a specific computational hardware device, such as an embedded hardware platform, or a specific processor of a computing device 102 and another portion may be targeted to run on a personal computer, such as a desktop or notebook. For example, a portion of the design 315 of the graphical model 315 may process data or perform loops that are time critical. In comparison, the display may not need to be updated in a time critical manner as the viewer's eyes may only perceive updates at a certain rate. The time critical data processing or loops may be embodied in source code 530 and/or object code 531 targeted for a specific processor of a certain speed or capability and the non-time critical code 530, 531 may be targeted for any general computing device. Various ways to process and target various portions of code may be employed to meet the desired functionality and/or execution of the design 315 represented by the graphical model 215.

At step 510 of illustrative method 500, one or more programs may be built from the automatically generated code to provide an executable form 225 to execute the design 315 represented by the graphical model 215. The code building tool 590 also provides for the building of the source code files 530 into object code 531 to generate one or more programs to run on a target platform and/or operating system or to be executed or use by a target verification tool 220. As depicted in FIG. 5B, the executable 225 provides an executable form of the design 315 represented by the graphical model 215.

The build process of illustrative step 510 may include compiling the code and linking libraries, drivers, and other programs via a make program or some other compiling utility. The code building tool 590 may invoke a compiler provided by software available with the operating system, such as a make utility on a UNIX operating system. The compiler may be provided from a software development package such as Visual C/C++ from Microsoft Corporation of Redmond, Wash. One ordinarily skilled in the art will recognize the code building tool 590 may invoke any type of compiler that is configured to and capable of translating the source code 530 into object code 531 to be executed by the target computing device 102.

Although the code generator 520 is generally discussed in terms of generating source code, the code generator 520 may provide code in any other form, such as object code, pre-existing source code, or other programmable instructions suitable for representing the functionality of the design 315 represented by the graphical model 215. Additionally, although the discussion herein is in terms of source code files 530 and object code 531 from a programming language like C, the code generator 520 may generate any type of programming related output, such as an interpreted programming language and/or scripting language. For example, the code generator 520 may generate code for perl, awk, VBscript, Javascript, tcl, or the technical computing programming language of MATLAB®. In other cases, the code generator 520 may generate output in other types of languages, such as the hardware description language of HDL or a custom or specific language of a verification tool 220. the code building tool may apply various types of languages in different ways in generating code and the code generator may build the code based on the type of language.

In other embodiments of step 510 of illustrative method 500, the executable form 225 of the model-based design 315 may not need to be generated, such as from an automatic code generation system. The graphical model 215 may already be in a form that is executable by either the graphical modeling tool 210 or the verification tool 220. In this manner, the graphical model 215 may provide the executable form 225 for testing or verification by the verification tool 220. Although generally discussed as an executable form 225 of the model-based design 315, the executable form 225 may also be referred to as a simulation form or as being simulateable in that the graphical model 215 can be executed, simulated, tested, or verified.

At step 515 of the illustrative method 500, the precondition design element 350 associated with the graphical model 215 is provided in a form applicable by the verification tool 220 or target system in testing or verifying the executable form 225 of the design 315. For example, the code generation process may provide a precondition specification 550 for a verification tool by processing or translating the precondition design element 350 into a desired or suitable form. The precondition design element 350 may be considered separate from the design 315 and therefore may not be included or incorporated in the executable form 225 of the design 315. For example, the precondition design element 350 may be intended and configured not to affect the behavior of the system design 315. In these cases, code may not be generated for the precondition design element 350.

In some embodiments, the code generation process described above may be used to provide a precondition specification 550 having a desired form and content for use by the target system, such as the verification tool 220. For example, the precondition specification 550 may be processed by illustrative step 510 to be provided in the same language as the code of the executable 225. In other embodiments, the precondition design element 350 and/or constraint 355 may be configured or defined to already have a form to be used and processed by a target verification tool 220. As such, the precondition specification 550 may be formed or provided by extracting, parsing, or otherwise using content from the configuration or definition of the precondition design element 350. In yet a further embodiment, the executable form 225 may be generated at illustrative step 510 to incorporate any type and/or form of mechanisms to provide for or apply the precondition design element 350 and/or precondition specification 550.

In view of steps 505, 510 and 515, it will be appreciated that the illustrative method 500 is directed towards providing an executable form 225 and a precondition specification 550 of the design 315 such that a verification tool 220 or other target system may execute testing or verification of the design 315 in a desired manner by applying the preconditions according to the precondition design element 350. At step 520 of illustrative method 500, the design 315 represented by the graphical model 315 is verified by the verification tool 220 by executing the executable form 225 and applying the preconditions according to the precondition specification 550. The manner and techniques used for performing verification and applying the preconditions will be based on the verification tool 220. Furthermore, the design and verification process may be interactive and illustrative methods 400 and 500 may be performed multiple times with different or modified designs 315 and/or precondition design elements 350 to reach or otherwise provide for the desired result or to otherwise finalize a design 315.

Conditions and Points of Observation

In further exemplary embodiments, the aforementioned preconditions and postconditions may be replaced by a single entity that can be referred to a condition. A condition can be a location in a model which may be either satisfied or unsatisfied by underlying data associated with the condition. A condition may serve as a precondition or a postcondition, and the same condition may serve as both a precondition and a postcondition. That is, a condition which serves as a precondition in one context may serve as a postcondition in another context, and vice versa.

Conditions may be placed in an "enforced satisfied status" or "enforced unsatisfied status." When placing the condition in an enforced satisfied status (for example), a computer may be instructed to assume that the condition is satisfied regardless of whether the condition would actually be satisfied by underlying data.

A condition may be used to validate the behavior of points of observation in a model. Points of observation may include locations in a model which are related to data. The points of observation may receive data, manipulate data, and/or output data. For example, points of observation may include blocks in a block diagram model of a dynamic system.

By combining enforced statuses with conditions, it becomes possible to evaluate points of observation in a model in a robust and efficient way. Postconditions which might not have been otherwise verifiable may be verified through the use of conditions and enforced statuses. Further, conditions may be evaluated even in the absence of underlying data which would otherwise be required in order to determine if the condition is satisfied (or not satisfied).

Figure 6A:
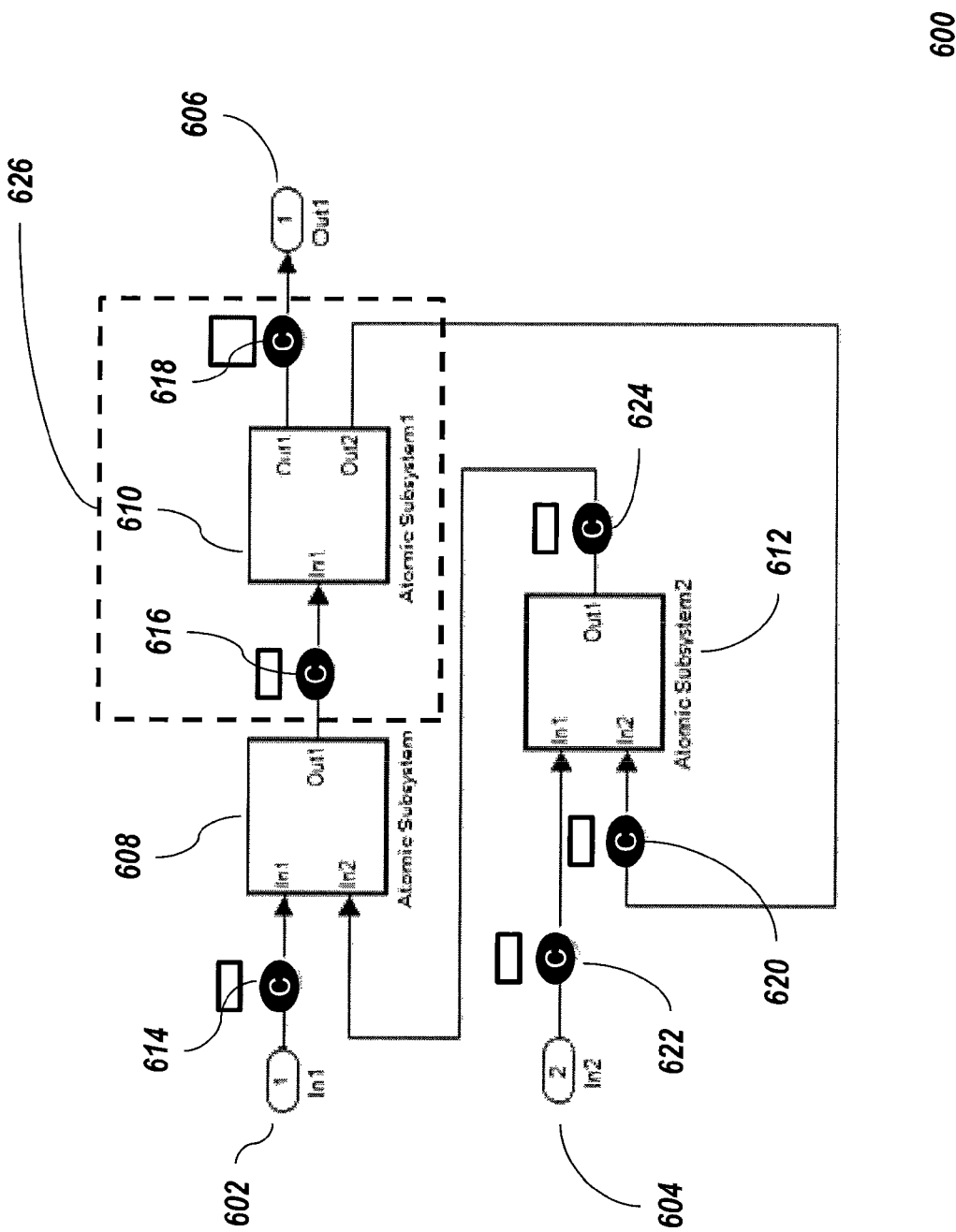
FIG. 6A is an exemplary model 600 of a dynamic system utilizing conditions.

FIG. 6A depicts an exemplary model 600 of a dynamic system utilizing conditions. model 600 is a block diagram model of a dynamic system. However, as described above, other types of models may also be used in conjunction with the verification techniques described herein.

The model 600 includes two input source blocks, a first input 602 (In1), and a second input 604 (In2). An output block 606 (Out1) is also provided.

The model 600 further includes a number of points of observation 608, 610, 612, represented by blocks. A point of observation can represent an entity in the model, which may be associated with data, having some observable characteristic which may influence the behavior of the model. For example, in a block diagram, a point of observation may be a block or a subsystem having multiple blocks. The points of observation may include input ports for receiving information and output ports for transmitting information. The points of observation may manipulate data to generate outputs values.

The input source blocks 602 and 604, the output block 606, and the points of observation 608, 610, 612 are connected by signals. In the model 600, each signal is associated with a condition 614, 616, 618, 620, 622, 624. However, in other embodiments conditions need not be placed on every signal, and need not be associated with signals specifically. Conditions may also be associated with, for example, input and/or output ports of the points of observation 608, 610, 612.

The portion of the model 600 surrounded by the dashed border is an example of a portion 626 of the model containing a condition 618 which may be subject to evaluation. There are a number of ways to validate the condition 618. For example, as shown in FIG. 6A, the value (and therefore satisfied or unsatisfied status) of condition 618 may be dependent on the first output (Out1) of the point of observation 610. The first output (Out1) of the point of observation 610 may in turn be dependent on the data passing through the condition 616, which may be dependent on the output (Out1) of the point of observation 608. Accordingly, in one embodiment, the validation tool may issue an Assumption. An Assumption instructs a point of observation associated with a condition to emit a value satisfying the condition. An Assumption may be represented using an Assume command. An Assume command may take as an argument the name of the condition to be assumed as valid. For example, when used to obtain a value associated with a condition named "C," an exemplary Assume command might be:
Assume (C)

FIG. 6B illustrates an embodiment in which the condition 618 may be evaluated using a stubAssumption. The difference between an Assumption and a stubAssumption is that an Assumption forces a point of observation to emit a value satisfying a condition, while a stubAssumption creates a construct known as a stub 628. The stub 628 may represent all possible values which satisfy a condition. For example, the stub 628 may represent all values which satisfy the condition 616. The stub 628 may allow the validation tool to determine, given that a first condition is satisfied, whether another condition is also satisfied.

A stub 628 may be created by the validation tool in response to a user command. A stub 628 may be represented as a block in a block diagram model. The stub 628 may replace any points of interest used to determine whether a given condition is valid, and also may replace any points of interest which are not necessary in order to determine whether the condition is valid.

A stubAssumption is more robust than an Assumption. A condition may be satisfied by an Assumption but not satisfied by a stubAssumption, because an Assumption of a condition represents only a subset of values that satisfy the condition, while a stubAssumption represents all values that satisfy the condition. However, a stubAssumption may be more complicated to implement in code and more time-consuming to validate the additional values. Thus, if a programmer merely wishes to know if a condition is satisfiable, rather than if a condition is always satisfied by a particular point of observation, the programmer may rely on an Assumption. The Assumption may force a point of observation to emit a small range of values that are possible outputs of the point of observation. If a value satisfies the condition, then it is known that the condition is satisfiable.

An Assumption or stubAssumption may be used in conjunction with a Prove command in order to evaluate a condition. For example, if the condition 616 of the model 600 is named "P3," and the condition 618 is named "P," then a user wishing to validate that the output at the condition 618 (P) is valid may issue a command such as:
Prove (stubAssume (P3), P)

This command may instruct the validation tool to prove whether condition 618 (P) is satisfied, given the assumption that the output at condition 616 (P3) is valid. The stubAssume (P3) command may cause the validation tool to generate a stub encapsulating any necessary information about the model 600 preceding the condition 616 (P3).

In one embodiment, the Prove( ) command may take two arguments. The first argument may represent the conditions in the model which are to be placed in an enforced satisfied condition (i.e., these conditions are assumed to be valid). The first argument may include a plurality of conditions. For example, as shown in FIG. 6C a portion 630 of the model 600 may include several inputs for which the stubAssume( ) command may be called. In the example depicted in FIG. 6C, a user may wish to validate the condition 616. If the condition 614 is named "A1" and the condition 624 is named "P4," then the first argument to the Prove( ) command may be a set of conditions which should be assumed.

A stub typically abstracts away a portion of the model. Therefore, a stubAssume is typically used in conjunction with a condition which may serve as either a precondition or a postcondition. When the portion of the model preceding a condition in question is very limited (such as when a condition can serve as only a precondition and not a postcondition), it may be unnecessary to create a stub. For example, if the condition represents an input data source, such as condition 614 in FIG. 6C (representing input data source 602 (In1)), it may be unnecessary to create a full stub for the condition.

Accordingly, in some embodiments, a user may specify that the validation tool may recognize when it is unnecessary to create a full stub, such as when a condition is connected to an input data source. If a user specifies that such a condition, such as the condition 614, should be the subject of an Assumption, then the validation tool may use an Assume command as described above. However, if the user does not specify an Assumption or a stubAssumption for a condition 614 attached to an input source block 602, the validation tool may rely on the input source block 602 to obtain suitable values in the same manner as with a stub. An exemplary command showing the use of a stubAssumption for the condition 624 (P4) and an input source block 602 for the condition 614 (A1) in order to evaluate a condition 616 (P3) may be:
Prove ({A1, stubAssume (P4)}, P3)

Based on this command, as shown in FIG. 6D the validation tool may create a stub 632 for the condition 624 (P4), which represents all valid values which satisfy the condition 624 (P4). The validation tool may rely on the input source block 602 for values which satisfy the condition 614 (A1). In effect, the condition 614 (A1) and the condition 624 (P4) may be treated as preconditions in order to determine whether the condition 616 (P3) is valid. In this example, the condition 616 (P3) may be treated as a postcondition. The validation tool may analyze the preconditions and postconditions in the manner described above in order to determine whether the condition 616 (P3) is satisfied.

The second argument for the Prove( ) command may be the condition which is to be evaluated.

Based on the conditions that are placed in an enforced satisfied condition as described by the first argument for the Prove( ) command, the validation tool may determine whether the condition described in the second argument is satisfied.

In some embodiments, the system may verify multiple conditions at once. For example, the second argument to the Prove( ) command may represent a set of conditions to be verified, as in the example below:

Prove ({A1, A2}, {P1, P2})

Techniques for verifying one or more conditions in a model will be described below with reference to the model 600 of FIG. 6A and the portion 626 of the model 600 shown in FIGS. 6B-6D.

Figure 7:
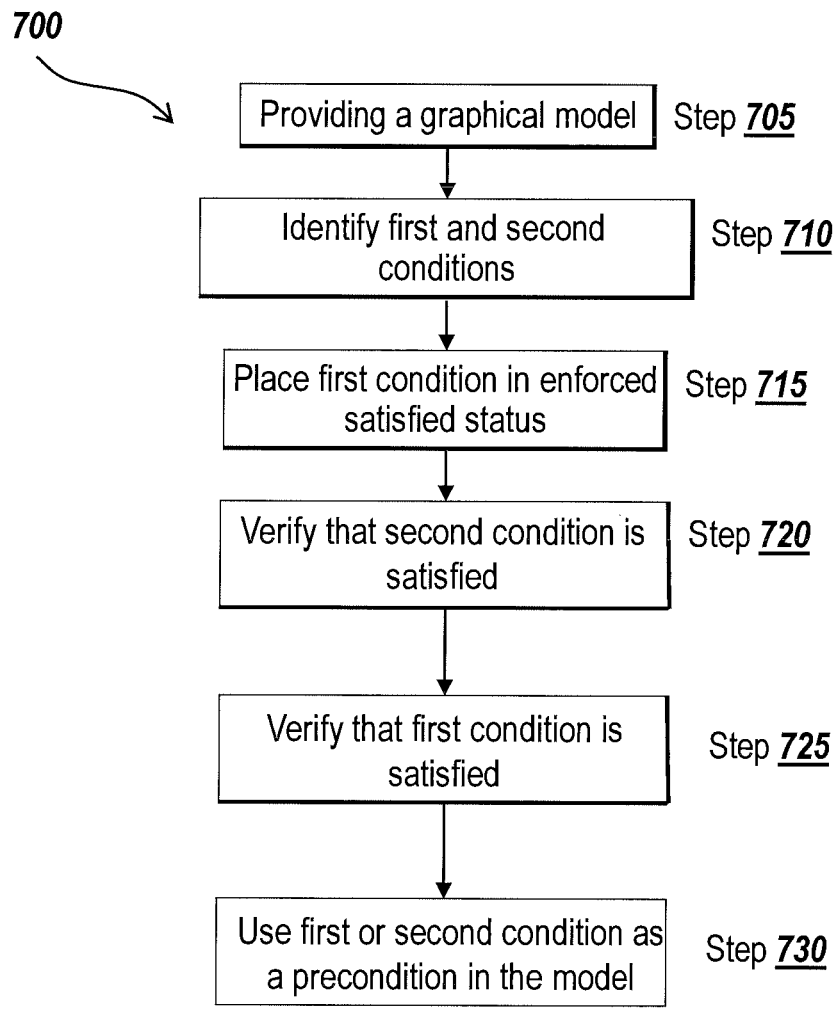
FIG. 7 is a flow diagram depicting an illustrative method for practicing an embodiment of the present invention to verify a first condition and a second condition in a model.

FIG. 7 is a flow diagram depicting an illustrative method for practicing an embodiment of the present invention to verify a first condition and a second condition in a model. The techniques described in FIG. 7 may be performed, for example, by the verification tool described above.

At step 705, a graphical model is provided, as described in steps 405 and 505, above. The graphical model may be a graphical block diagram model, and may include a plurality of points of observation, such as blocks or subsystems which represent one or more blocks. The model may be provided in a graphical modeling environment, such as Simulink of the MathWorks, Inc.

The points of observation may be related to data in the model. For example, the points of observation may manipulate data, may receive data at one or more input ports, and may output data at one or more output ports.

At step 710, a plurality of conditions are identified. The conditions may include a first condition and a second condition. The first condition and second condition may be in the model, for example at an input or output of a point of observation. In one embodiment, the second condition may be associated with an output of a first point of observation from among the plurality of points of observation. The first and second conditions may be associated with a portion of the model that is subject to evaluation. The first condition and/or second condition may be associated with an element external to the model, such as an input source or output source, or another model such as a state diagram model.

The model may also be analyzed to determine which conditions are not necessary in order to evaluate the first and second condition, and may disable any conditions which are not used in the validation process. For example, the conditions may be evaluated during a simulation of the model, or during a design phase of the model. The first condition and/or the second condition may be activated or deactivated based on a state of the model during an execution or simulation of the model. If it is determined that a particular subsystem will not be reached during the current phase of execution, conditions associated with the subsystem may be deactivated. The conditions may be reactivated when the subsystem becomes reachable.

At step 715, the first condition may be placed in an enforced satisfied status. The enforced satisfied status indicates that the first condition is presumed to be in a satisfied status. For example, an Assume or stubAssume command may be issued for the first condition to place the first condition in a satisfied status.

At step 720, the second condition may be evaluated by the verification tool to determine whether the second condition is satisfied. For example, the verification tool may process a Prove command as described above.

If an Assume command was used at step 715 in order to force a point of observation to emit a value which satisfies the first condition, the value may be carried through one or more points of observation which intervene in a data path between the first condition and the second condition. This may cause further values to be generated, as when the values are received as an input at a point of observation such as a block or a subsystem. The point of observation may use the values to manipulate information, and may cause output values to be generated and forwarded through the data path. At some point, the data path crosses the second condition, and a value for the data at the second condition is analyzed to determine whether the second condition is satisfied. If so, the validation tool may return "true" as the output of the Prove command. If not, the validation tool may return "false" as the output of the Prove command.

If a stubAssume command was used at step 715, then a range of values representing the values which will satisfy the first condition may be output. The range of values may be carried through the data path, as described above, and the second condition may be analyzed for each of the values in the range in order to determine whether the second condition is satisfied for each of the values. If so, the validation tool may return "true" as the output of the Prove command. If not, the validation tool may return "false" as the output of the Prove command.

In many situations, there are a limited number of values which satisfy the first condition (and which therefore need to be tested). For example, the first condition may be satisfied only with respect to integers in the range [−10, 10]. Accordingly, in such a situation there are a limited number of values which need to be tested to verify the second condition.

There may be an infinite or extremely large number of values which satisfy a particular condition. In this case, the validation tool may apply one or more principles to determine whether the second condition will always be satisfied by the first condition. For example, if the second condition may be satisfied by any value over "100" and any value of the first condition will cause a value of 100 or greater to reach the second condition, the validation tool may determine that the second condition is satisfied for every value of the first condition without testing each value individually.

At step 725, after the second condition is determined to be satisfied, the verification tool may verify that the first condition is in an unenforced satisfied status. For example, the verification tool may reverse the assumptions: if the first condition was assumed to be satisfied in order to evaluate whether the second condition was satisfied, the validation tool may, at step 725, assume that the second condition is in an enforced satisfied status and verify that the first condition is satisfied. This may involve repeating steps 710-720 while reversing the roles of the first condition and the second condition.

At step 730, if the first condition and second condition are determined to be satisfied, the first condition and/or the second condition may be used as preconditions in the model. Accordingly, if a Prove( ) command was issued at step 720 to verify the second condition ("C2"), the Prove( ) command may be changed to an Assume (C2) command and the validation tool may proceed to use the second condition (which served as a postcondition in steps 705-725) as a precondition to evaluate another portion of the model.

The techniques described above can be used with multiple conditions serving as preconditions, and/or multiple conditions serving as postconditions. For example, rather than using a first condition as a precondition and second condition as a postcondition, the validation tool may use first and second conditions as preconditions in order to verify a third condition as a postcondition. Alternatively, the validation tool may be capable of using a first condition as a precondition to verify second and third conditions as postconditions.

The technique described in FIG. 7 assumes that a condition is satisfied and uses the enforced satisfied status of the condition to evaluate another condition. However, it is also possible to assume that a condition is not satisfied, or can never be satisfied, and use the enforced unsatisfied status of the condition to determine whether another condition is satisfiable. Such a technique is described below with reference to FIG. 8.

Figure 8:
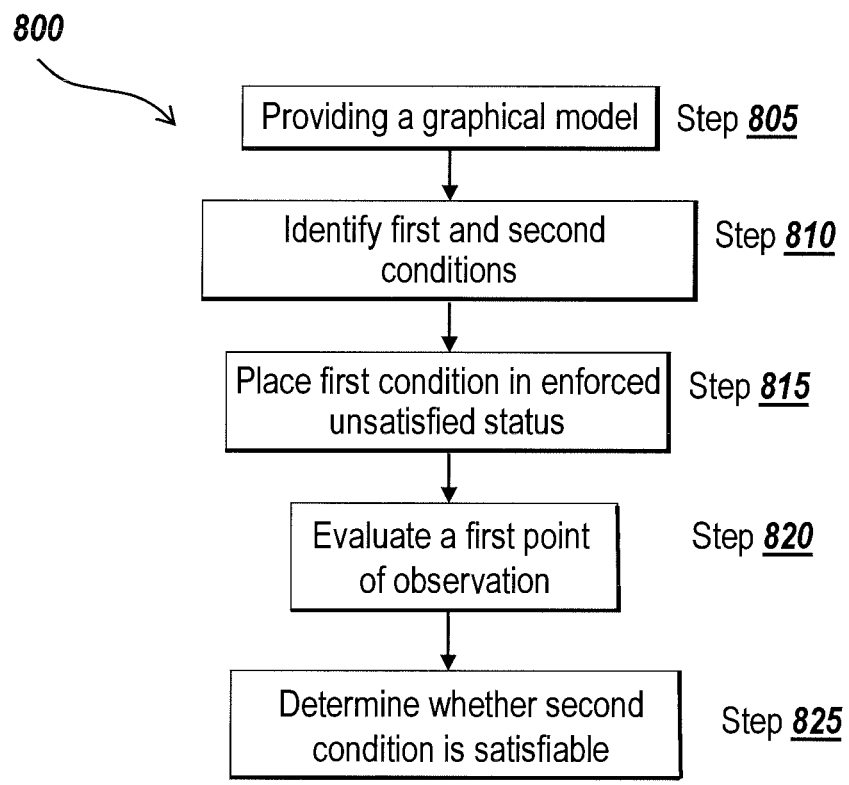
FIG. 8 is a flow diagram depicting an illustrative method to determine whether it is possible to satisfy a condition.

FIG. 8 is a flow diagram depicting an illustrative method for practicing an embodiment of the present invention to determine whether it is possible to satisfy a condition.

At step 805, a graphical model is provided. At step 810, a plurality of conditions are identified. The conditions may include a first condition and a second condition. Steps 805 and 810 therefore generally correspond to steps 705 and 710, above.

At step 815, the first condition may be placed in an enforced unsatisfied status. That is, instead of assuming that the first condition is satisfied, it is assumed that the first condition is not satisfied. This may be accomplished for example, by using an Assume or stubAssume command for a first condition ("C1"), but instructing the command to assume that the first condition (C1) is not valid. For example:
Assume (!C1)
or
stubAssume (~C1)

If the Assume command is used to place the first condition in an enforced unsatisfied status, the validation tool may cause a point of observation to emit a value which does not satisfy the first condition. If the stubAssume command is used to place the first condition in an enforced unsatisfied status, the validation tool may test the values which cause the first condition to be unsatisfied. As noted above with respect to step 715, although the first condition may be in an unsatisfied state with respect to an infinite number of possible values the validation tool may apply general principles instead of evaluating every possible value that does not satisfy the first condition.

At step 820, a first point of observation may be evaluated, at least in part based on the unsatisfied status of the first condition. The first point of observation may, for example, receive input data through a signal affiliated with the first condition and output data through a signal affiliated with the second condition. Accordingly, the first point of observation may accept a value that does not satisfy the first condition, process the value to generate an output value, and forward the output value to the second condition.

At step 825, the verification tool may determine whether it is possible to satisfy the second condition. For example, if the value generated at step 820 satisfies the second condition, then the validation tool determines that the second condition is satisfiable (whether or not the first condition is satisfied). If no value generated at step 820 can satisfy the second condition, then the validation tool determines that the second condition is unsatisfiable unless the first condition is satisfied (and perhaps not even in that case, as when the second condition is unsatisfiable for all possible values).

If it is determined that the second condition is satisfiable regardless of the satisfaction status of the first condition, then it is known that the first condition is not required to be satisfied in order for the second condition to be satisfied. Accordingly, in future evaluations, the validation tool may eliminate the first condition from evaluation when called upon to evaluate the second condition as a post condition, as described in step 710, above.

In view of the structure, functions and operations of the systems and methods as described herein, the present invention provides a design technique and mechanism for specifying preconditions for the test, analysis, and/or verification of a model-based design.

The precondition/condition design element of the present invention can be used in a model-based design approach in such a manner as to not affect or alter the behavior of the system but at the same time provide constraints for the verification of the system. The system design represented by the graphical model may be used as a design specification for an implementation, and associated with or in the same graphical model the precondition design element may be used as a design specification for verification. Instead of using the configuration or development environment of the verification tool to specify preconditions, the designer may specify preconditions in the graphical modeling environment in the same modeling language and format as the design specification for implementation. This enables the designer to more easily and efficiently associate results from verification and corresponding preconditions with the design specification provided by the graphical model.

Many alterations and modifications may be made by those having ordinary skill in the art without departing from the spirit and scope of the invention. Therefore, it must be expressly understood that the illustrated embodiments have been shown only for the purposes of example and should not be taken as limiting the invention, which is defined by the following claims. These claims are to be read as including what they set forth literally and also those equivalent elements which are insubstantially different, even though not identical in other respects to what is shown and described in the above illustrations.

What is claimed is:

1. A non-transitory electronic device readable medium storing instructions that, when executed by a processor, cause the processor to:
   access a model in a graphical modeling environment, the model including:
      a first condition that is either satisfied or unsatisfied depending on data that is associated with the first condition,
      a point of observation, the point of observation generating an output that is at least partially dependent on the data associated with the first condition, and
      a second condition that is either satisfied or unsatisfied depending, at least partially, on the output of the point of observation; and
   validate at least a portion of the model, the validating comprising:
      placing the first condition in an enforced satisfied status, wherein a verification tool is forced to assume that the first condition is satisfied regardless of whether the condition would actually be satisfied by underlying data,
      generating the output from the point of observation based on the enforced satisfied status of the first condition, and
      verifying that the second condition is in a satisfied status based at least in part on the output of the point of observation.

2. The medium of claim 1, wherein the model is an executable block diagram model of a system.

3. The medium of claim 2, wherein the point of observation is a block in the block diagram model.

4. The medium of claim 2, wherein the point of observation is a subsystem in the block diagram model, the subsystem comprising one or more blocks.

5. The medium of claim 1, wherein:
the point of observation is a first point of observation,
the processor further identifies a second point of observation associated with second output information that is at least partially dependent on the first condition, and
the second output information is used as input information into the first point of observation.

6. The medium of claim 5, wherein the placing the first condition in the enforced satisfied status comprises causing the second point of observation to output a value satisfying the first condition.

7. The medium of claim 5, wherein the placing the first condition in an enforced satisfied status comprises instructing the modeling environment that the input information into the first point of observation satisfies the first condition.

8. The medium of claim 1, wherein the validating at least a portion of the model comprises receiving an instruction, the instruction identifying:
one or more conditions indicated to be in an enforced satisfied status, the one or more conditions comprising the first condition; and
the second condition, the second condition being evaluated based at least in part on the one or more conditions indicated to be in an enforced satisfied status.

9. The medium of claim 1, wherein the first condition and second condition are textually or graphically indicated on the model.

10. The medium of claim 9, wherein the first condition and second condition are associated with at least one of a value or a range of values for one or more of the following: an output, a signal, an attribute of a signal, a state, a data element, a parameter, and a property of an object.

11. The medium of claim 1, further comprising instructions for:
validating at least a second portion of the model, wherein the second condition is used as a precondition for a third condition in the validating of the second portion of the model, the third condition being validated at least in part based on the second condition.

12. The medium of claim 1, wherein the portion of the model is validated during a simulation of the model.

13. The medium of claim 1, further comprising instructions for:
displaying a verification tool on a display device, the verification tool presenting a graphical interface for identifying at least one of the first condition and the second condition.

14. The medium of claim 1, wherein the first condition and the second condition are identified during a design of the model.

15. The medium of claim 1, wherein at least one of the first condition and the second condition is associated with an element external to the model.

16. The medium of claim 1, wherein at least one of the first condition and the second condition is activated or deactivated based on a state of the model during an execution of the model.

17. A method implemented in an electronic device, the method causing a processor to:
access, using the processor, a model in a graphical modeling environment, the model comprising:
a first condition that is either satisfied or unsatisfied depending on data that is associated with the first condition,
a point of observation, the point of observation generating an output that is at least partially dependent on the data associated with the first condition, and
a second condition that is either satisfied or unsatisfied depending, at least partially, on the output of the point of observation; and
validate, using the processor, at least a portion of the model, the validating comprising:
placing the first condition in an enforced satisfied status, wherein a verification tool is forced to assume that the first condition is satisfied regardless of whether the condition would actually be satisfied by underlying data,
generating the output from the point of observation based on the enforced satisfied status of the first condition, and
verifying that the second condition is in a satisfied status based at least in part on the output of the point of observation.

18. A system comprising:
a non-transitory storage medium for storing a model in a graphical modeling environment, the model comprising:
a first condition that is either satisfied or unsatisfied depending on data that is associated with the first condition,
a point of observation, the point of observation generating an output that is at least partially dependent on the data associated with the first condition, and
a second condition that is either satisfied or unsatisfied depending, at least partially, on the output of the point of observation; and
a processor programmed with instructions that, when executed, cause the processor to:
validate at least a portion of the model, the validating comprising:
placing the first condition in an enforced satisfied status, wherein a verification tool is forced to assume that the first condition and the second condition are satisfied regardless of whether the condition would actually be satisfied by underlying data,
generating the output from the point of observation based on the enforced satisfied status of the first condition, and
verifying that the second condition is in a satisfied status based at least in part on the output of the point of observation.

19. A non-transitory electronic device storage readable medium storing instructions that, when executed by a processor, cause the processor to:
access a model in a graphical modeling environment, the model comprising:
a first condition that is either satisfied or unsatisfied depending on data that is associated with the first condition,
a point of observation representing an elemental dynamic system, the point of observation generating an output that is at least partially dependent on the data associated with the first condition, and
a second condition that is either satisfied or unsatisfied depending, at least partially, on the output of the point of observation;
validate at least a portion of the model, the validating comprising:
placing the first condition in an enforced satisfied status, wherein a verification tool is forced to assume that the first condition is satisfied regardless of whether the first condition would actually be satisfied by underlying data, evaluating the point of observation based, at least in part, on the satisfied first condition, the evaluating comprising:

generating the output of the point of observation based on the enforced satisfied status of the first condition, and determining whether it is possible to satisfy the second condition based on the evaluating, wherein the determining includes verifying that the second condition is in a satisfied status based at least in part on the output of the point of observation.

20. A non-transitory electronic device readable storage medium storing instructions that, when executed by a processor, cause the processor to:

identify one or more preconditions, the one or more preconditions include one or more condition placed in an enforced status and providing one or more inputs constraints in a portion of a model;

identify a postcondition, the postcondition includes one or more condition placed in an enforced status, and representing a proposition to be evaluated based on the one or more preconditions such that a verification tool is forced to assume that the condition is satisfied regardless of whether the condition would actually be satisfied by underlying data;

evaluate the postcondition based at least in part on the one or more preconditions to generate one or more output based on the enforced satisfied status of the one or more condition and to determine if the one or more condition is in an enforced status; and wherein if it is determined the one or more condition is in a satisfied status, use the evaluated postcondition as a new precondition in the same portion or a different portion of the model.

* * * * *

UNITED STATES PATENT AND TRADEMARK OFFICE
CERTIFICATE OF CORRECTION

| | | |
|---|---|---|
| PATENT NO. | : 8,903,688 B1 | Page 1 of 1 |
| APPLICATION NO. | : 13/078353 | |
| DATED | : December 2, 2014 | |
| INVENTOR(S) | : William J. Aldrich et al. | |

It is certified that error appears in the above-identified patent and that said Letters Patent is hereby corrected as shown below:

Title page, in item (56), under "Other Publications", line 3, delete "$ADPM_{13}$ checkmate." and insert --ADPM_checkmate.-- in lieu thereof.

Signed and Sealed this
Twenty-first Day of April, 2015

Michelle K. Lee
*Director of the United States Patent and Trademark Office*